US008000018B2

(12) United States Patent
Benítez et al.

(10) Patent No.: US 8,000,018 B2
(45) Date of Patent: Aug. 16, 2011

(54) KÖHLER CONCENTRATOR

(75) Inventors: Pablo Benítez, Madrid (ES); Juan Carlos Miñano, Madrid (ES); Pablo Zamora, Madrid (ES); Maikel Hernandez, Madrid (ES); Aleksandra Cvetkovic, Madrid (ES)

(73) Assignee: Light Prescriptions Innovators, LLC, Altadena, CA (US)

( * ) Notice: Subject to any disclaimer, the term of this patent is extended or adjusted under 35 U.S.C. 154(b) by 75 days.

(21) Appl. No.: 12/621,047

(22) Filed: Nov. 18, 2009

(65) Prior Publication Data

US 2010/0123954 A1    May 20, 2010

Related U.S. Application Data

(60) Provisional application No. 61/115,892, filed on Nov. 18, 2008, provisional application No. 61/268,129, filed on Jun. 8, 2009, provisional application No. 61/278,476, filed on Oct. 6, 2009.

(51) Int. Cl.
*G02B 27/10* (2006.01)
*G02B 3/08* (2006.01)
*F21V 5/00* (2006.01)

(52) U.S. Cl. .......................... 359/626; 359/743; 362/327

(58) Field of Classification Search .................. 359/618, 359/619, 621, 622, 626, 627, 741, 742, 743; 126/698; 362/327, 336, 338
See application file for complete search history.

(56) References Cited

U.S. PATENT DOCUMENTS

| | | | |
|---|---|---|---|
| 2,186,123 A | 1/1940 | Räntsch | 88/24 |
| 3,296,923 A | 1/1967 | Miles | 88/24 |
| 3,302,016 A | 1/1967 | Larraburu | 240/41.3 |
| 4,069,812 A | 1/1978 | O'Neill | 126/271 |
| 4,497,013 A | 1/1985 | Ohta | 362/32 |
| 4,741,613 A | 5/1988 | Vanderwerf | 353/38 |
| 4,769,750 A | 9/1988 | Matsumoto et al. | 362/268 |
| 5,098,184 A | 3/1992 | van den Brandt et al. | 353/102 |
| 5,662,401 A | 9/1997 | Shimizu et al. | 353/38 |
| 5,786,939 A | 7/1998 | Watanabe | 359/621 |
| 6,639,733 B2 | 10/2003 | Miñano et al. | 359/728 |
| 6,896,381 B2 | 5/2005 | Benitez et al. | 359/858 |
| 7,152,985 B2 | 12/2006 | Benitez et al. | 359/857 |
| 7,160,522 B2 | 1/2007 | Miñano Dominguez et al. | 422/186.3 |
| 7,460,985 B2 | 12/2008 | Benitez et al. | 703/2 |
| 2002/0148497 A1 | 10/2002 | Sasaoka et al. | 136/243 |
| 2003/0075167 A1 | 4/2003 | Miñano Dominguez et al. | 126/680 |

(Continued)

FOREIGN PATENT DOCUMENTS

WO    WO 2006/030433    3/2006

(Continued)

OTHER PUBLICATIONS

M. Hernández, P. Benitez, J.C. Miñano, J.L. Alvarez, V. Diaz, and J. Alsons, *Sunlight Spectrum on Cell Through Very High Concentration Optics*, in Proceedings of 3rd World Conference on Photovoltaic Energy Conversion, 2003, (May 11-18, 2003).

(Continued)

*Primary Examiner* — Jack Dinh
(74) *Attorney, Agent, or Firm* — Drinker Biddle & Reath, LLP

(57) ABSTRACT

One example of a solar voltaic concentrator has a primary Fresnel lens with multiple panels, each of which forms a Köhler integrator with a respective panel of a lenticular secondary lens. The resulting plurality of integrators all concentrate sunlight onto a common photovoltaic cell. Luminaires using a similar geometry are also described.

19 Claims, 15 Drawing Sheets

U.S. PATENT DOCUMENTS

| | | | |
|---|---|---|---|
| 2003/0075213 A1 | 4/2003 | Chen | 136/246 |
| 2004/0246606 A1 | 12/2004 | Benitez et al. | 359/858 |
| 2005/0081909 A1 | 4/2005 | Paull | 136/246 |
| 2005/0086032 A1 | 4/2005 | Benitez et al. | 703/1 |
| 2008/0002423 A1 | 1/2008 | Minano et al. | 362/555 |
| 2008/0047605 A1 | 2/2008 | Benitez et al. | 136/259 |
| 2008/0092879 A1 | 4/2008 | Miñano Dominguez et al. | 126/699 |
| 2008/0223443 A1 | 9/2008 | Benitez et al. | |
| 2008/0245401 A1 | 10/2008 | Winston et al. | 136/246 |
| 2008/0316761 A1 | 12/2008 | Miñano et al. | 362/518 |
| 2009/0071467 A1 | 3/2009 | Benitez et al. | 126/685 |

FOREIGN PATENT DOCUMENTS

| | | |
|---|---|---|
| WO | WO 2006/102317 | 9/2006 |
| WO | WO 2007/016363 | 2/2007 |
| WO | WO 2007/084518 A2 | 7/2007 |
| WO | WO 2007/104028 | 9/2007 |
| WO | WO 2007/127153 A2 | 11/2007 |
| WO | WO 2008/103987 | 8/2008 |

OTHER PUBLICATIONS

L.W. James, *Use of imaging refractive secondaries in photovoltaic concentrators*, SAND 89-7029, (1989).

P. Benítez, J. C. Miñano, *Ultrahigh-numerical-aperture imaging concentrator*, J. Opt. Soc. Am. A, vol. 14, No. 8, pp. 1988-1997, (1997).

H. Ries, J.M. Gordon, M. Laxen, *High-flux photovoltaic solar concentrators with Kaleidoscope based optical designs*, Solar Energy, vol. 60, No. 1, pp. 11-16, (1997).

W. Cassarly, *Nonimaging Optics: Concentration and Illumination*, in the Handbook of Optics, 2nd ed., pp. 2.23-2.42, (McGraw-Hill, New York, 2001).

J.L. Alvarez., M. Hernández, P. Benítez, J.C. Miñano, *TIR-R Concentrator: a new compact high-gain SMS design*, in *Nonimaging Optics: Maximum Efficiency Light Transfer VI*, Roland Winston, Ed., Proc. SPIE 4446, pp. 32-42, (2001).

D.G. Jenkins, *High-uniformity solar concentrators for photovoltaic systems*, in *Nonimaging Optics: Maximum Efficiency Light Transfer VI*, Roland Winston, Ed., Proc. SPIE 4446, pp. 52-59, (2001).

J.J. O'Gallagher, R. Winston, *Nonimaging solar concentrator with near-uniform irradiance for photovoltaic arrays*, in *Nonimaging Optics: Maximum Efficiency Light Transfer VI*, Roland Winston, Ed., Proc. SPIE 4446, pp. 60-64, (2001).

P. Benítez and J.C. Miñano, *Concentrator Optics for the Next-Generation Photovoltaics*, in Next Generation Photovoltaics, A. Martí and A Luque, Eds., pp. 285-325, (2004).

J. C. Miñano, M. Hernández, P. Benitez, J. Blen, O. Dross, R. Mohedano, A. Santamaria, *Free-form integrator array optics*, in *Nonimaging Optics and Efficient Illumination Systems II*, R. Winston & T.J. Koshel, Eds., Proc. SPIE vol. 5942, pp. 59420C-1 to C-12, (2005).

K. Araki et al., *Development of a new 550X concentrator module with 3J cells—performance and reliability*, in Photovoltaic Specialists Conference, 2005. Conference Record of the Thirty-first IEEE . . . (Jan. 2005).

P. Benítez, A. Cvetkovic, R. Winston, G. Díaz, L. Reed, J. Cisneros, A. Tovar, A. Ritschel, J. Wright, *High-Concentration Mirror-Based Köhler Integrating System for Tandem Solar Cells*, 4th World Conference on Photovoltaic Energy Conversion, Hawaii, (2006).

J. Chaves, "Introduction to Nonimaging Optics", Chapter 17, pp. 467-512, (CRC Press, 2008).

http://www.daido.co.jp/english/rd/7503.pdf.

J. Gordon, "How innovative optics are serving the photovoltaic revolution," SPIE Newsroom 10.1117/2.1200602.0132 (2006), available at http://www.solfocus.com/en/downloads/news/20071227123356_SPIE_2006-02-27.pdf.

R. Pardell, "Sol3g HCPV Systems," document date Jun. 12, 2007, . publication date unknown.

Lawrence W. James, *Effects of Concentrator Chromatic Aberration on Multi-Junction Cells*, First WCPEC;; Hawaii, pp. 1799-1802 (Dec. 5-9, 1994).

Xiaohui Ning, Joseph O'Gallaher, and Roland Winston, *Optics of Two-Stage Photovoltaic Concentrators with Dielectric Second Stages*, Applied Optics, vol. 26(7), pp. 1207-1212 (Apr. 1, 1987).

Roland Winston, Juan C. Miñano and Pablo Benitez, *Nonimaging Optics*, Elsevier Academic Press Publications, pp. 185, 323-324 (2005).

M. Collares-Pereira, *High Temperature Solar Collector with Optimal Concentration: Non-focusing Fresnel Lens with Secondary Concentrator*, in *Nonimaging Optics*, Roland Winston, Ed., SPIE Milestone Series vol. MS 106, pp. 213-225 (1995).

P.A. Davies, *Design of Single-Surface Spherical Lenses as Secondary Concentrators for Photovoltaic Cells*, Pure Appl. Opt 2, 315-324 (1993).

J.C. Miñano, P. Benítez, J.C. González, *RX: A nonimaging concentrator*, Appl. Opt. 34, pp. 2226-2235, (1995).

O. Dross, R. Mohedano, M. Hernandez, A. Cvetkovic, J.C. Miñano and P. Benitez, *Kohler Integrators Embedded into Illumination Optics Add Functionality*, Illumination Optics—Proceedings of the SPIE, vol. 7103, pp. 7103G-7103G-12 (Sep. 2008).

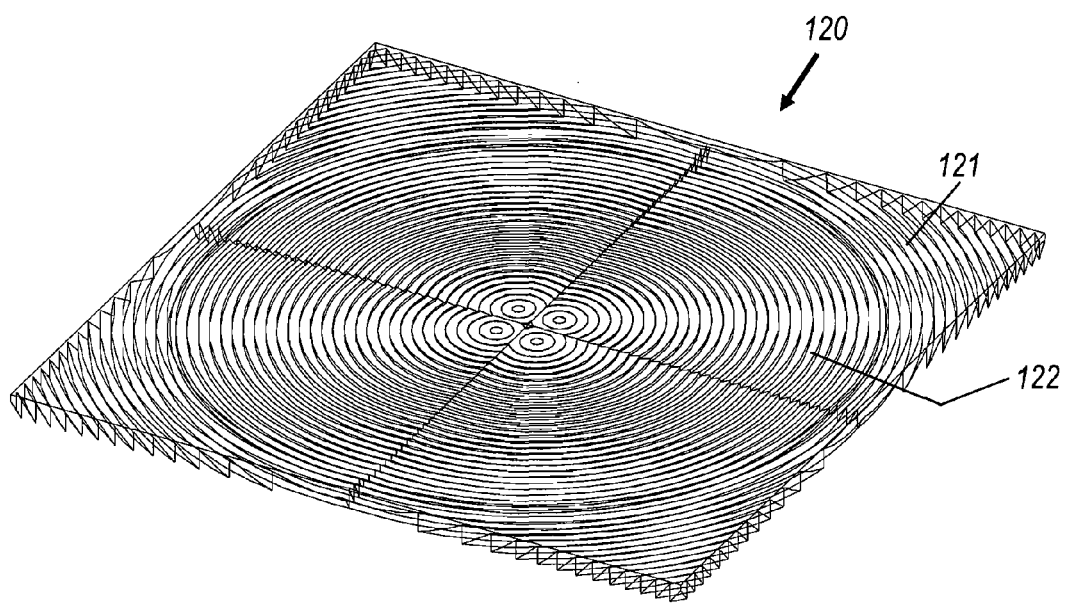
FIG. 12
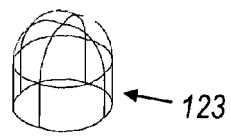

KÖHLER CONCENTRATOR

CROSS REFERENCE TO RELATED APPLICATIONS

This application claims benefit of U.S. Provisional Patent Application No. 61/115,892 titled "Kohler Concentrator", filed Nov. 18, 2008, U.S. Provisional Application No. 61/268,129 filed Jun. 8, 2009, of the same title, both in the names of Miñano et al., and U.S. Provisional Patent Application No. 61/278,476, titled "Köhler concentrator azimuthally combining radial-Köhler sub-concentrators", filed Oct. 6, 2009 in the name of Benítez et al., which are incorporated herein by reference in their entirety.

Reference is made to commonly-assigned International Publication Nos. WO 2007/016363 to Miñano et al. and WO 2007/103994 to Benítez et al. which are incorporated herein by reference in their entirety.

Embodiments of the devices described and shown in this application may be within the scope of one or more of the following U.S. patents and patent applications and/or equivalents in other countries: U.S. Pat. Nos. 6,639,733, issued Oct. 28, 2003 in the names of Miñano et al., 6,896,381, issued May 24, 2005 in the names of Benítez et al., 7,152,985 issued Dec. 26, 2006 in the names of Benítez et al., and 7,460,985 issued Dec. 2, 2008 in the names of Benítez et al.; WO 2007/016363 titled "Free-Form Lenticular Optical Elements and Their Application to Condensers and Headlamps" to Miñano et al and US 2008/0316761 of the same title published Dec. 25, 2008 also in the names of Miñano et al; WO 2007/103994 titled "Multi-Junction Solar Cells with a Homogenizer System and Coupled Non-Imaging Light Concentrator" published Sep. 13, 2007 in the names of Benítez et al; US 2008/0223443, titled "Optical Concentrator Especially for Solar Photovoltaic" published Sep. 18, 2008 in the names of Benítez et al.; and US 2009/0071467 titled "Multi-Junction Solar Cells with a Homogenizer System and Coupled Non-Imaging Light Concentrator" published Mar. 19, 2009 in the names of Benítez et al.

GLOSSARY

Concentration-Acceptance Product (CAP)—A parameter associated with any solar concentrating architecture, it is the product of the square root of the concentration ratio times the sine of the acceptance angle. Some optical architectures have a higher CAP than others, enabling higher concentration and/or acceptance angle. For a specific architecture, the CAP is nearly constant when the geometrical concentration is changed, so that increasing the value of one parameter lowers the other.

Fresnel Facet—Element of a discontinuous-slope concentrator lens that deflects light by refraction.

TIR Facet—Element of a discontinuous-slope concentrator lens that deflects light by total internal reflection.

Primary Optical Element (POE)—Optical element that receives the light from the sun or other source and concentrates it towards the Secondary Optical Element.

Secondary Optical Element (SOE)—Optical element that receives the light from the Primary Optical Element and concentrates it towards the solar cell or other target.

Cartesian Oval—A curve (strictly a family of curves) used in imaging and non-imaging optics to transform a given bundle of rays into another predetermined bundle, if there is no more than one ray crossing each point of the surface generated from the curve. The so-called Generalized Cartesian Oval can be used to transform a non-spherical wavefront into another. See Reference [10], page 185, Reference [17].

BACKGROUND

Triple junction photovoltaic solar cells are expensive, making it desirable to operate them with as much concentration of sunlight as practical. The efficiency of currently available multi junction photovoltaic cells suffers when local concentration of incident radiation surpasses ~2,000-3,000 suns. Some concentrator designs of the prior art have so much non-uniformity of the flux distribution on the cell that "hot spots" up to 9,000-11,000× concentration happen with 500× average concentration, greatly limiting how high the average concentration can economically be. Kaleidoscopic integrators can reduce the magnitude of such hot spots, but they are more difficult to assemble, and are not suitable for small cells.

There are two main design problems in Nonimaging Optics, and both are relevant here. The first is called "bundle-coupling" and its objective is to maximize the proportion of the light power emitted by the source that is transferred to the receiver. The second, known as "prescribed irradiance," has as its objective to produce a particular illuminance pattern on a specified target surface using a given source emission.

In bundle-coupling, the design problem consists in coupling two ray bundles $M_i$ and $M_o$, called the input and the output bundles respectively. This means that any ray entering into the optical system as a ray of the input bundle $M_i$ exits it as a ray of the output bundle $M_o$, and vice versa. Thus the successfully coupled parts of these two bundles $M_i$ and $M_o$ comprise the same rays, and thus are the same bundle $M_c$. This bundle $M_c$ is in general $M_c = M_i \cap M_o$. In practice, coupling is always imperfect, so that $M_c \subset M_i$ and $M_c \subset M_o$.

In prescribed-irradiance, however, it is only specified that one bundle must be included in the other, $M_i$ in $M_o$. Any rays of $M_i$ that are not included in $M_o$ are for this problem disregarded, so that $M_i$ is effectively replaced by $M_c$. In this type of solution an additional constraint is imposed that the bundle $M_c$ should produce a prescribed irradiance on a target surface. Since $M_c$ is not fully specified, this design problem is less restrictive than the bundle coupling one, since rays that are inconvenient to a particular design can be deliberately excluded in order to improve the handling of the remaining rays. For example, the periphery of a source may be under-luminous, so that the rays it emits are weaker than average. If the design edge rays are selected inside the periphery, so that the weak peripheral region is omitted, and only the strong rays of the majority of the source area are used, overall performance can be improved.

Efficient photovoltaic concentrator (CPV) design well exemplifies a design problem comprising both the bundle coupling problem and the prescribed irradiance problem. $M_i$ comprises all rays from the sun that enter the first optical component of the system. $M_o$ comprises those rays from the last optical component that fall onto the actual photovoltaic cell (not just the exterior of its cover glass). Rays that are included in $M_i$ but are not coupled into $M_o$ are lost, along with their power. (Note that in computer ray tracing, rays from a less luminous part of the source will have less flux, if there are a constant number of rays per unit source area.) The irradiance distribution of incoming sunlight must be matched to the prescribed (usually uniform) irradiance on the actual photovoltaic cell, to preclude hot-spots. Optimizing both problems, i.e., to obtain maximum concentration-acceptance product as well a uniform irradiance distribution on the solar cell's active surface, will maximize efficiency. Of course this is a very difficult task and therefore only partial solutions have been found.

Good irradiance uniformity on the solar cell can be potentially obtained using a light-pipe homogenizer, which is a well known method in classical optics. See Reference [1]. When a light-pipe homogenizer is used, the solar cell is glued to one end of the light-pipe and the light reaches the cell after some bounces on the light-pipe walls. The light distribution on the cell becomes more uniform with light-pipe length. The use of light-pipes for concentrating photo-voltaic (CPV) devices, however, has some drawbacks. A first drawback is that in the case of high illumination angles the reflecting surfaces of the light-pipe must be metalized, which reduces optical efficiency relative to the near-perfect reflectivity of total internal reflection by a polished surface. A second drawback is that for good homogenization a relatively long light-pipe is necessary, but increasing the length of the light-pipe both increases its absorption and reduces the mechanical stability of the apparatus. A third drawback is that light pipes are unsuitable for relatively thick (small) cells because of lateral light spillage from the edges of the bond holding the cell to the end of the light pipe, typically silicone rubber. Light-pipes have nevertheless been proposed several times in CPV systems, see References [2], [3], [4], [5], [6], and [7], which use a light-pipe length much longer than the cell size, typically 4-5 times.

Another strategy for achieving good uniformity on the cell is the Köhler illuminator. Köhler integration can solve, or at least mitigate, uniformity issues without compromising the acceptance angle and without increasing the difficulty of assembly.

Referring to FIG. 2, the first photovoltaic concentrator using Kohler integration was proposed (see Reference [8]) by Sandia Labs in the late 1980's, and subsequently was commercialized by Alpha Solarco. A Fresnel lens 21 was its primary optical element (POE) and an imaging single surface lens 22 (called SILO, for SIngLe Optical surface) that encapsulates the photovoltaic cell 20 was its secondary optical element (SOE). That approach utilizes two imaging optical lenses (the Fresnel lens and the SILO) where the SILO is placed at the focal plane of the Fresnel lens and the SILO images the Fresnel lens (which is uniformly illuminated) onto the photovoltaic cell. Thus, if the cell is square the primary can be square trimmed without losing optical efficiency. That is highly attractive for doing a lossless tessellation of multiple primaries in a module. On the other hand, the primary optical element images the sun onto the secondary surface. That means that the sun image 25 will be formed at the center of the SILO for normal incidence rays 24, and move towards position 25 on the secondary surface as the sun rays 26 move within the acceptance angle of the concentrator due to tracking perturbations and errors. Thus the concentrator's acceptance is determined by the size and shape of the secondary optical element.

Despite the simplicity and high uniformity of illumination on the cell, the practical application of the Sandia system is limited to low concentrations because it has a low concentration-acceptance product of approximately 0.3°(±1° at 300×). The low acceptance angle even at a concentration ratio of 300× is because the imaging secondary cannot achieve high illumination angles on the cell, precluding maximum concentration.

Another previously proposed approach uses four optical surfaces, to obtain a photovoltaic concentrator for high acceptance angle and relatively uniform irradiance distribution on the solar cell (see Reference [9]). The primary optical element (POE) of this concentrator should be an element, for example a double aspheric imaging lens, that images the sun onto the aperture of a secondary optical element (SOE). Suitable for a secondary optical element is the SMS designed RX concentrator described in References [10], [11], [12]. This is an imaging element that works near the thermodynamic limit of concentration.

A good strategy for increasing the optical efficiency of the system (which is a critical merit function) is to integrate multiple functions in fewer surfaces of the system, by designing the concentrator optical surfaces to have at least a dual function, e.g., to illuminate the cell with wide angles, at some specified approximation to uniformity. That entails a reduction of the degrees of freedom in the design compared to the ideal four-surface case. Consequently, there is a trade-off between the selected geometry and the homogenization method, in seeking a favorable mix of optical efficiency, acceptance angle, and cell-irradiance uniformity. In refractive concentrators and tandem multi-junction cells, chromatic dispersion can cause the different spectral bands to have different spatial distributions across the cell, leading to mismatches in photocurrent density that reduce efficiency, making complete homogenization even more valuable.

There are two ways to achieve irradiance homogenization. The first is a Köhler integrator, as mentioned before, where the integration process is along both dimensions of the ray bundle, meridional and sagittal. This approach is also known as a 2D Köhler integrator. The other strategy is to integrate in only one of the ray bundle's dimensions; thus called a 1D Köhler integrator. These integrators will typically provide a lesser homogeneity than is achievable with in 2D, but they are easier to design and manufacture, which makes them suitable for systems where uniformity is not too critical. A design method for calculating fully free-form 1D and 2D Köhler integrators was recently developed (see References [13], [14]), where optical surfaces are used that have the dual function of homogenizing the light and coupling the design's edge rays bundles.

SUMMARY

Embodiments of the present invention provide different photovoltaic concentrators that combine high geometric concentration, high acceptance angle, and high irradiance uniformity on the solar cell. In some embodiments, the primary and secondary optical elements are each lenticulated to form a plurality of segments. A segment of the primary optical element and a segment of the secondary optical element combine to form a Köhler integrator. The multiple segments result in a plurality of Köhler integrators that collectively focus their incident sunlight onto a common target, such as a photovoltaic cell. Any hotspots are typically in different places for different individual Köhler integrators, with the plurality further averaging out the multiple hotspots over the target cell.

In some embodiments, the optical surfaces are modified, typically by lenticulation (i.e., the formation on a single surface of multiple independent lenslets) to produce Köhler integration. Although the modified optical surfaces behave optically quite differently from the originals, they are macroscopically very similar to the unmodified surface. This means that they can be manufactured with the same techniques (typically plastic injection molding or glass molding) and that their production cost is the same.

An embodiment of the invention provides an optical device comprising: a primary optical element having a plurality of segments, which in an example are four in number; and a secondary optical element having a plurality of segments, which in an example are four lenticulations of an optical surface of a lens; wherein each segment of the primary optical element, along with a corresponding segment of the secondary optical element, forms one of a plurality of Köhler integrators. The plurality of Köhler integrators are arranged in position and orientation to direct light from a common source onto a common target. The common source, where the device is a light collector, or the common target, where the device is a luminaire, may be external to the device. For example, in the case of a solar photovoltaic concentrator, the source is the sun. Whether it is the common source or the common target, the other may be part of the device or connected to it. For example, in a solar photovoltaic concentrator, the target may be a photovoltaic cell. Further embodiments of the device, however, could be used to concentrate or collimate light between an external common source and an external common target.

BRIEF DESCRIPTION OF THE DRAWINGS

The above and other aspects, features and advantages of the present invention will be apparent from the following more particular description thereof, presented in conjunction with the following drawings wherein:

FIG. 12 is a perspective view of a quad-lenticulated Kohler concentrator where the primary is composed of Fresnel and TIR facets.

DETAILED DESCRIPTION OF THE EMBODIMENTS

A better understanding of various features and advantages of the present invention may be obtained by reference to the following detailed description of embodiments of the invention and accompanying drawings, which set forth illustrative embodiments in which various principles of the invention are utilized.

Three types of primary optical elements are described herein: one comprising a double refraction optic having a multiplicity of Fresnel facets, the second a hybrid optic comprising a multiplicity of Fresnel and TIR facets and the third comprising an array of reflectors. All three exhibit overall N-fold symmetry wherein the individual elements (Fresnel or TIR facets, mirror) have rotational symmetry. In the embodiments taught in this invention the secondary refractive elements have the same N-fold symmetry as the primary optic.

Several Köhler integrating solar concentrators are described herein. They are the first to combine a non flat array of Köhler integrators with concentration optics. Although, the embodiments of the invention revealed herein have quadrant symmetry, the invention does not limit embodiments to this symmetry but can be applied, by those skilled in the art, to other symmetries (N-fold, where N can be any number greater than two) once the principles taught herein are fully understood.

Figure 1:
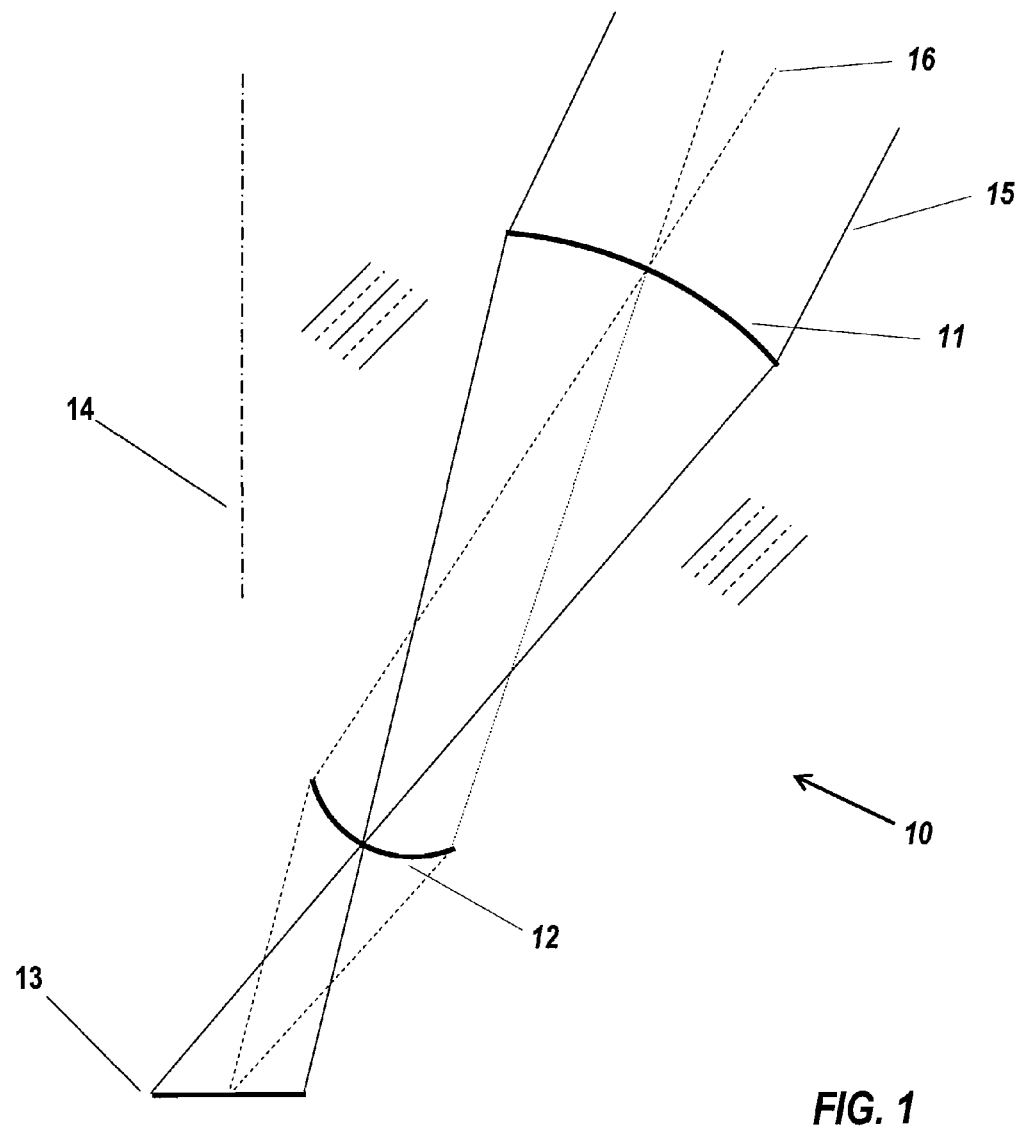
FIG. 1 shows design rays used for calculating the desired shape of a radial Köhler refractive lenticulation pair.

FIG. 1 shows lenticulation 10, comprising two refractive off-axis surfaces, primary optical element (POE) 11 and secondary optical element (SOE) 12, and illuminating cell 13. The final Radial Köhler concentrator will be the combination of several such lenticulation pairs, with common rotational axis 14 shown as a dot-dashed line. Solid lines 15 define the spatial edge rays and dotted lines 16 define the angular edge rays. They show the behavior of parallel and converging rays, respectively. In an embodiment, each optical element lenticulation 11, 12 may be one or more optical surfaces, each of which may be continuous or subdivided. For example, POE 11 may be a Fresnel lens, with one side flat and the other side formed of arcuate prisms.

Radial Köhler concentrators are 1D Köhler integrators with rotational symmetry. This makes the design process much easier than a 1D free-form Köhler integrator. Furthermore, rotational symmetry makes the manufacturing process as simple for a lenticular form as for any other aspheric rotational symmetry. The design process, however, first designs a 2D optical system, and then applies rotational symmetry.

Although the irradiance distribution produced by a radial Köhler concentrator has a hotspot, it is much milder than that produced by an imaging system. If $\alpha$ is the system acceptance angle, $\alpha_s$ is the sun's angular radius, and k is a constant that depends on the shape of the cell's active area (where k=1 for a round cell and k=4/$\pi$ for a square cell), it can easily be seen that the hotspot generated by a radial Köhler approach is proportional to $k*(\alpha/\alpha_s)$ times the average optical concentration, while the hotspot generated by an aplanatic device is proportional to $k*(\alpha/\alpha_s)^2$ times the average optical concentration. For instance, if $\alpha=1°$, $\alpha_s=\frac{1}{4}°$ (the angular radius of the sun as seen from Earth), and k=1, the hotspot created by a radial Köhler is around 4 times the average concentration, while the aplanatic design produces a hotspot 16 times the average concentration. For a square cell (k=4/$\pi$) the corresponding hotspots are 5 and 20 times the average concentration.

Figure 3:
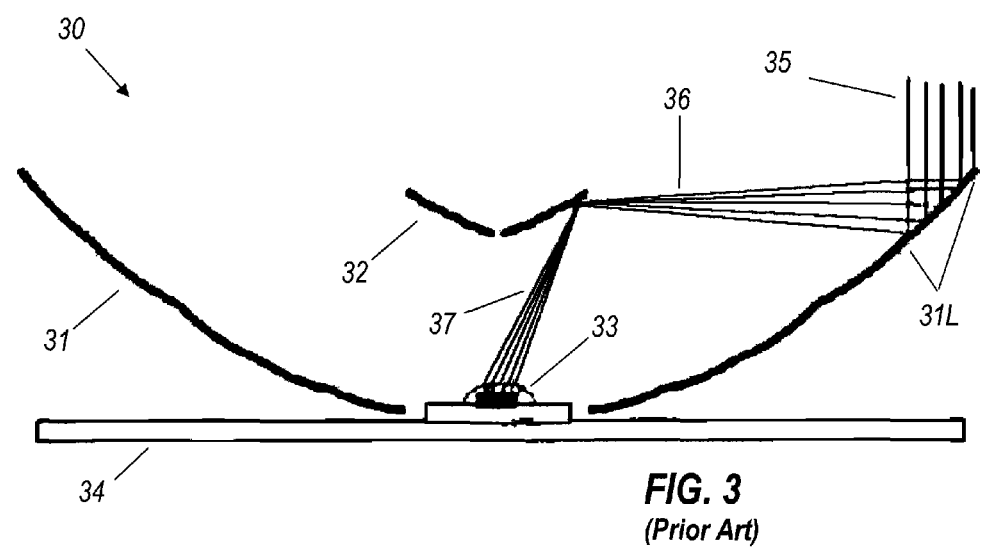
FIG. 3 shows a two mirror Cassegrain-type reflective concentrator of sunlight.

The radial Köhler concept has been applied in CPV systems using a TIR-R concentrator (see Reference [15]) and to a two-mirror Cassegrain-type reflective concentrator (see Reference [16]). FIG. 3 shows a prior art two-mirror Cassegrain-type reflective concentrator 30, comprising lenticulated primary mirror 31, secondary mirror 32, and encapsulated solar cell 33 mounted on heat sink 34. Concave reflector-lenticulation segment 31L reflects incoming rays 35 as converging rays 36 focusing onto secondary mirror 32, which in turn spreads them over cell 33, a 1 cm² cell of the triple-junction type. Concentrator 30 is designed to work at $C_g=650\times$ with $\pm 0.9°$ of acceptance angle, and has optical efficiency of 78%, with a maximum irradiance peak on the cell of 1200 suns.

Figure 2:
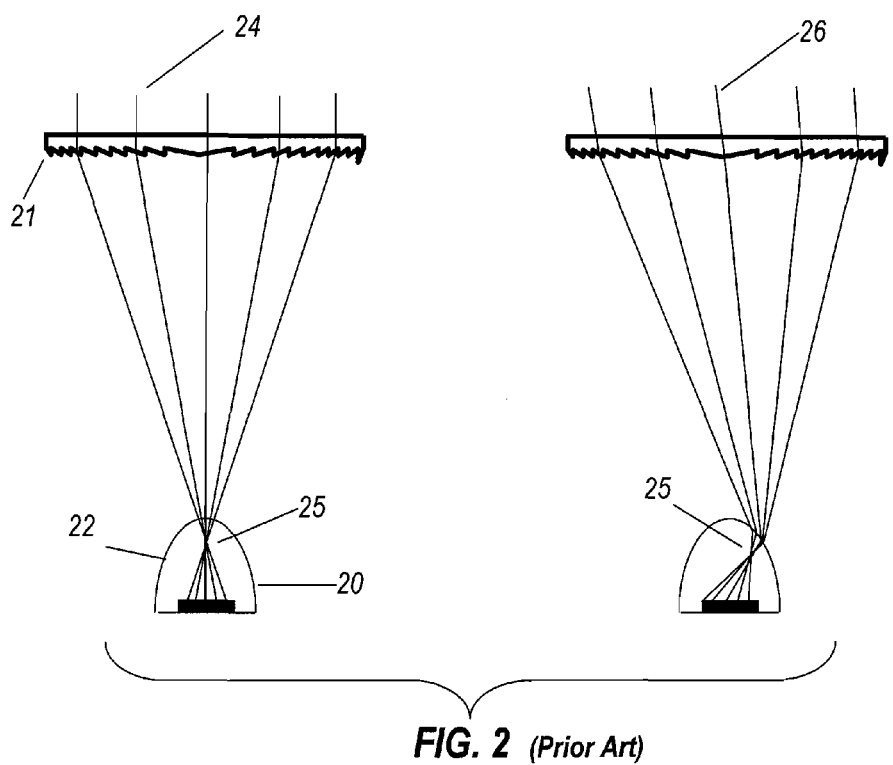
FIG. 2 shows certain principles of the Fresnel-SILO concentrator developed by Sandia Labs.

In this Radial Köhler design, the average concentration and the peak concentration can be high, so that it is necessary to introduce a further degree of freedom in the radial Köhler design, in order to keep the irradiance peak below 2000 suns. To perform the integration in a second direction, the present application comprises a concentrator with four subsystems (having quad-symmetry), hereinafter referred to as segments, that symmetrically compose a whole that achieves azimuthal integration, while keeping each of the four subsystems rotationally symmetric and thus maintaining ease of manufacture, since each is actually a part of a complete rotationally symmetric radial Köhler system, analogous to those of FIG. 2 and FIG. 3.

Figure 4:
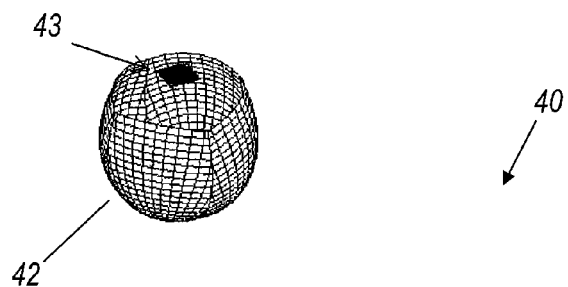
FIG. 4 shows a quad-lenticular XR Köhler concentrator that uses azimuthal integration.
Figure 4:
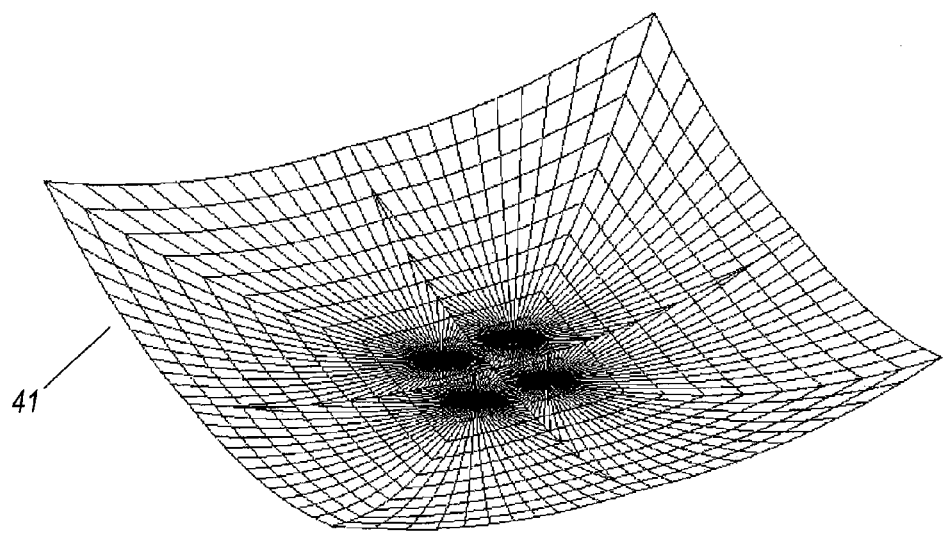

Better homogenization is produced when using a two-directional free-form Köhler integrator instead of a rotational-symmetric one. A possible type of free-form Köhler system is the XR, comprising a primary reflector and a secondary refractor. FIG. 4 shows an embodiment of an XR Köhler concentrator 40, comprising four-fold segmented primary mirror 41, four-fold segmented secondary lens 42, and photovoltaic cell 43. The geometric concentration Cg=804× is apparent based on the relative sizes of mirror 41 and cell 43. The design is for a square unitary cell (cell side=1). Device size is thus scaled to actual cell size. The thermal scheme used to remove waste heat from the cell follows from that cell size. Shadowing of mirror 41 by lens 42 is only 1%, since the width of lens 42 is one tenth that of mirror 41.

Figure 5A:
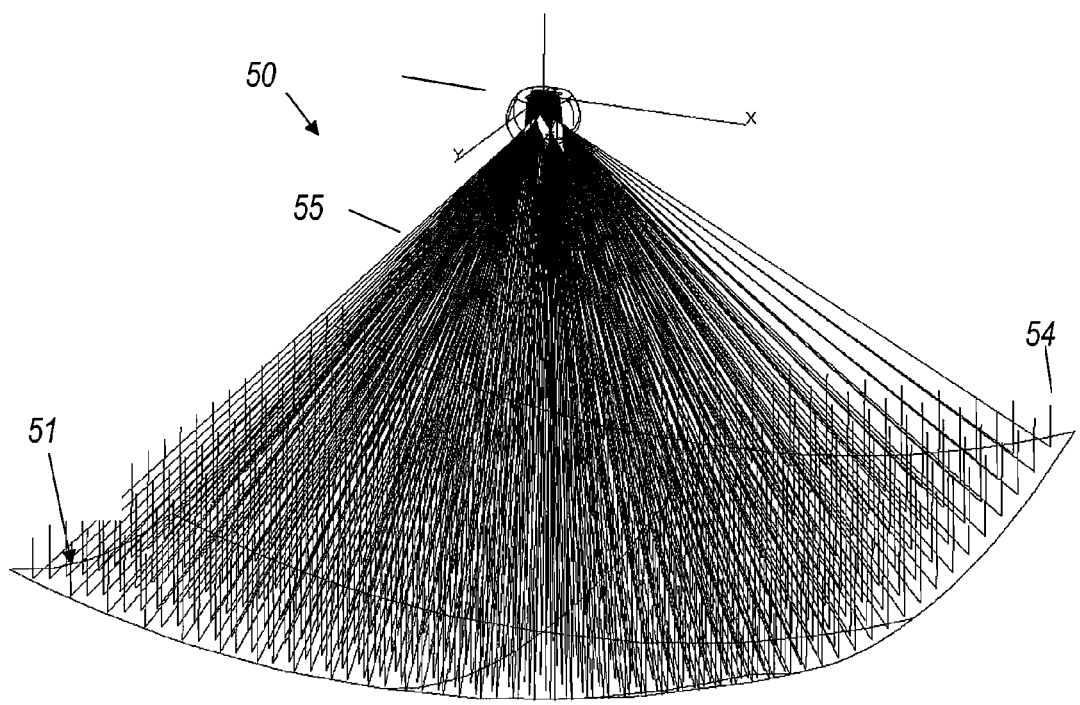
FIG. 5A is a ray diagram of the XR concentrator shown in FIG. 4.
Figure 5B:
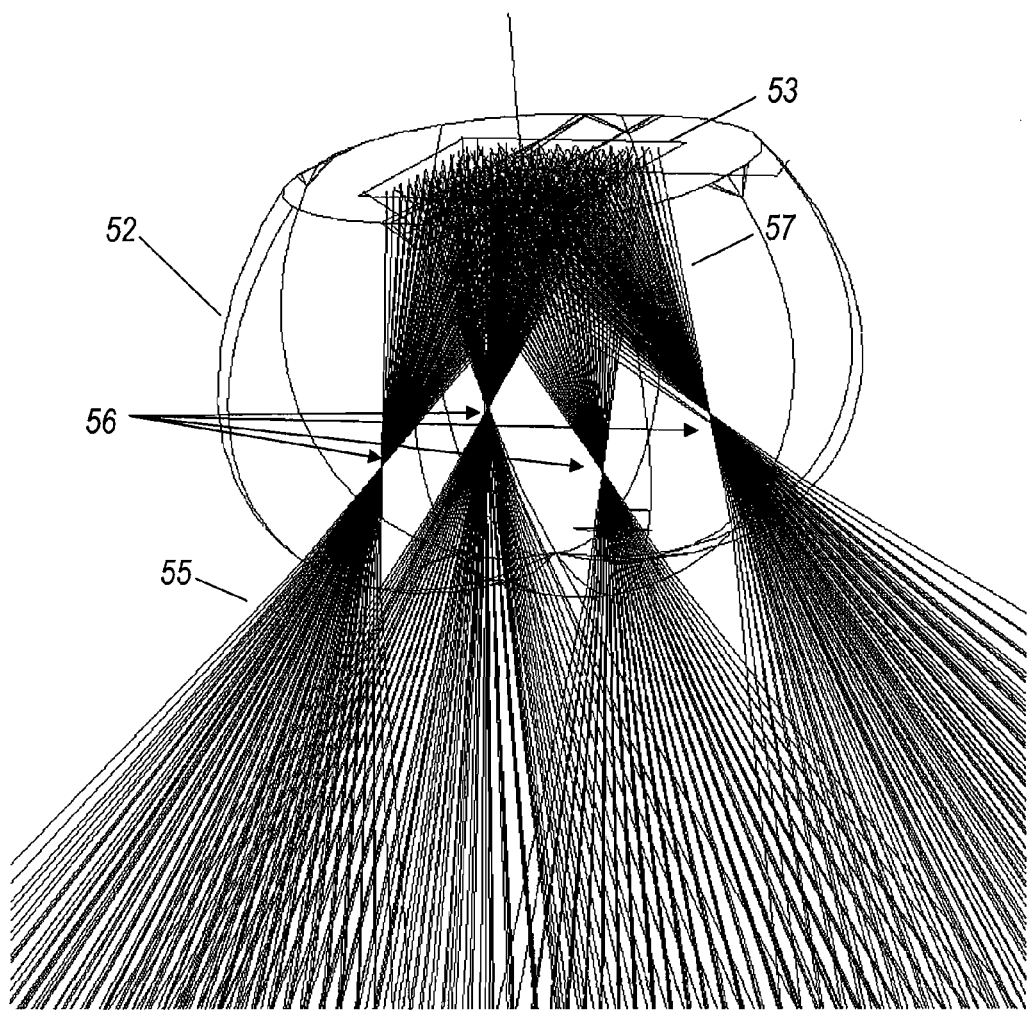
FIG. 5B is an enlarged detail of FIG. 5A.

FIG. 5A shows a system similar to that of FIG. 4 with rays. Primary mirror 51 and secondary lens of concentrator 50 are shown with de-emphasized lines to highlight parallel rays 54, which are reflected by mirror 51 into converging rays 55. FIG. 5B shows a close-up view of converging rays 55 focusing to points 56 on the surface of secondary lens 52 (shown de-emphasized), and then spread out to uniformly cover cell 53. Primary mirror 51 and secondary lens 52 each comprise four segments working in pairs. Each mirror segment focuses incoming solar rays onto the corresponding secondary lens segment, while the secondary lens segment, in turn, images its primary-mirror segment onto the photovoltaic cell. The irradiance thereupon is the sum of the four images of the primary mirror segments, each of which is a paraboloidal mirror focused at the edge of the Secondary Optical Element (SOE) and having its axial direction normal to the cell. Thus all rays normally incident upon primary mirror 51 go to cell 53.

The actual design of the four identical segments begins with the requirements of some level of concentration upon a particular cell, thereby setting the size of the mirror. The size of the secondary lens is set by a desired acceptance angle $\pm \alpha$ and the mirror focal length selected, as well as the maximum acceptance angle of the cell. Even though it is in optical contact with the secondary lens, the high refractive index of the cell generally means that rays beyond a maximum off-axis acceptance angle will be mostly wasted by reflection. The value for a particular cell can vary from 60° to 80°, depending upon the microscopic particulars of the cell and its interface with the lens. To design the shape of the individual secondary-lens segment, edge rays are emitted in a reverse direction from arriving solar rays, into all off-axis directions within the cell acceptance angle. Then the lens is the Cartesian oval that focuses these rays upon the periphery of the primary mirror. Secondary lens 52 is a single refractive surface, and its body occupies the entire space between the surface and cell 53, meaning it is immersed in lens 52.

Assuming a mirror reflectivity of 95%, a cover with 91% transmission, and taking into account the Fresnel-reflection losses of the secondary lens, the resulting optical efficiency of one example of a concentrator as shown in FIGS. 4 and 5 is 81%, and the geometric concentration is 804×, for which it achieves a 90% efficiency acceptance angle $\pm 1.4°$. The system has an concentration-acceptance product of approximately 0.7, which is a considerable improvement over the prior art illustrated by FIG. 2.

Figure 9:
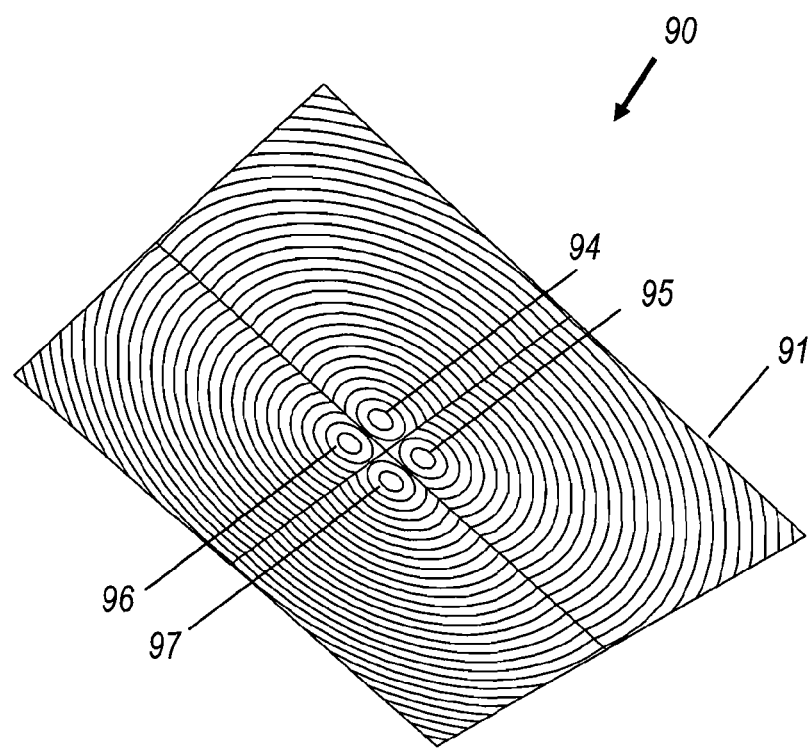
FIG. 9 is a perspective view of the primary and secondary lenses of a quad-lenticulated RR Köhler concentrator.
Figure 9:
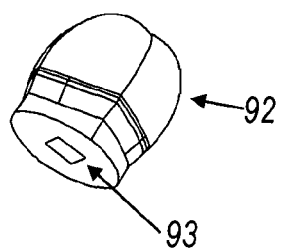

Referring to FIG. 9, a further embodiment of a Köhler integrating concentrator is a free-form Köhler concentrator 90 in the form of an RR, with both primary and secondary elements being refractive. The primary refractive element of RR Köhler integrating concentrator 90 is a Fresnel lens 91 with quad-symmetry, having four lens segments or sub-lenses, as shown. A thin Fresnel lens with one flat surface is a good approximation to a single refractive surface, with only small losses due to rounded facet tips and non-vertical draft angles as demanded by the practicalities of molding. The Fresnel lens 91 is not rotationally symmetric, but comprises four sub-lenses each of which may be seen as an off-center square piece of a symmetric Fresnel lens. This is most conspicuous at the center of the lens, where the physical ribs of lens 90 are visibly clover-leaf shaped, rather than circular. Secondary lens 92 also comprises four sub-lenses, each aligned with a corresponding sub-lens of primary lens 91. All four sub-lens pairs send solar rays within the acceptance angle to cell 93. The centers of rotation for each of the four Fresnel lenses are indicated in FIG. 9 by the centers of circles 94, 95, 96 and 97. The axis of rotation is perpendicular to the plane of the Fresnel lens.

The RR Köhler in FIG. 9 achieves 510× of geometrical concentration with an acceptance of $\pm 1.47°$, which is a very good result for this concentration level as compared to the prior art. This high acceptance angle can be achieved with f-numbers from 0.85 to 1.5, which is a range of interest for application to solar concentrators.

Figure 6:
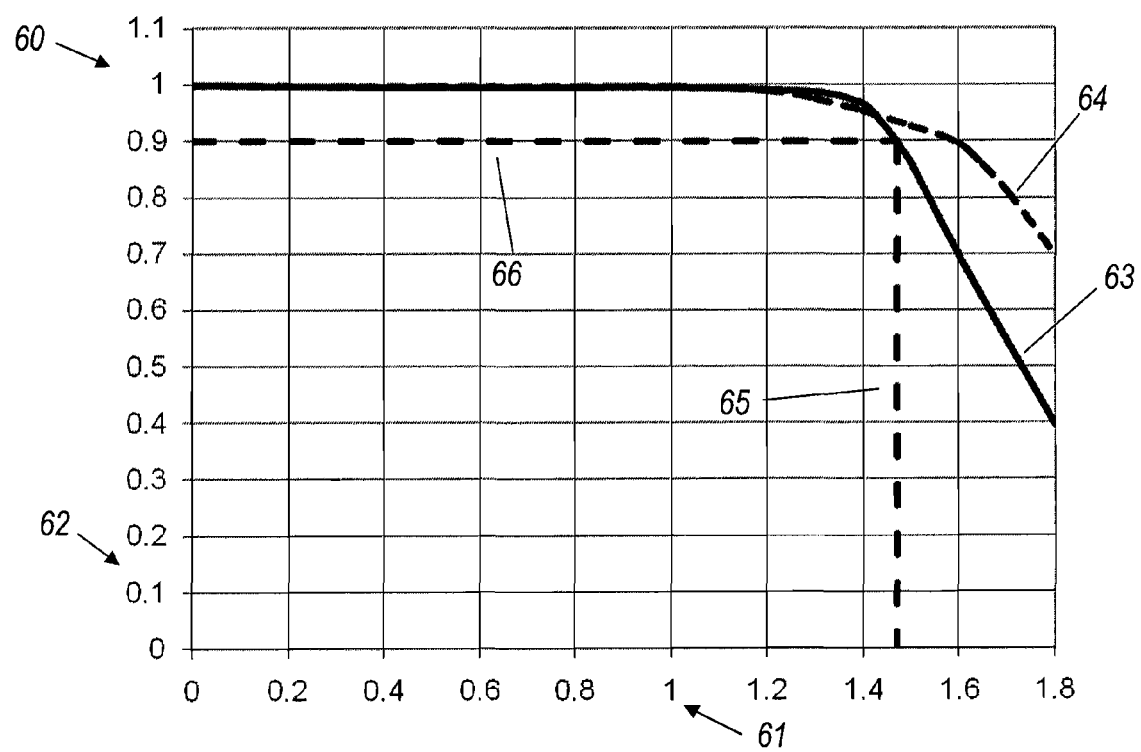
FIG. 6 is a graph of optical efficiency of the concentrator shown in FIG. 4.
Figure 7:
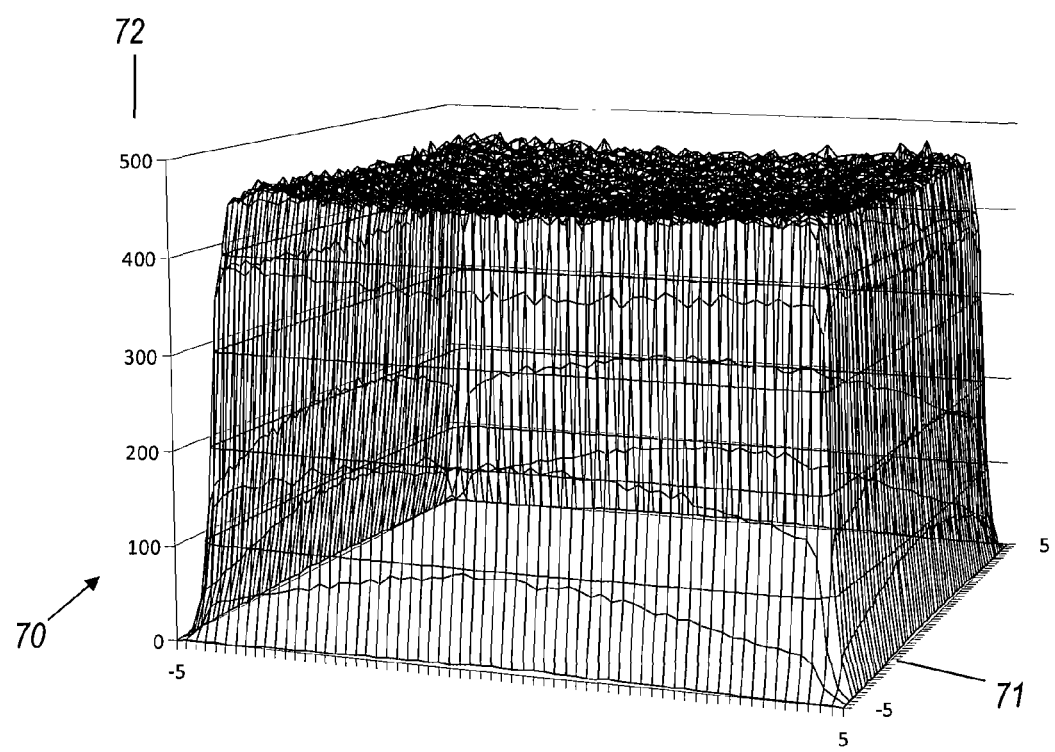
FIG. 7 is a flux plot for on-axis concentration by the concentrator shown in FIG. 4.
Figure 8:
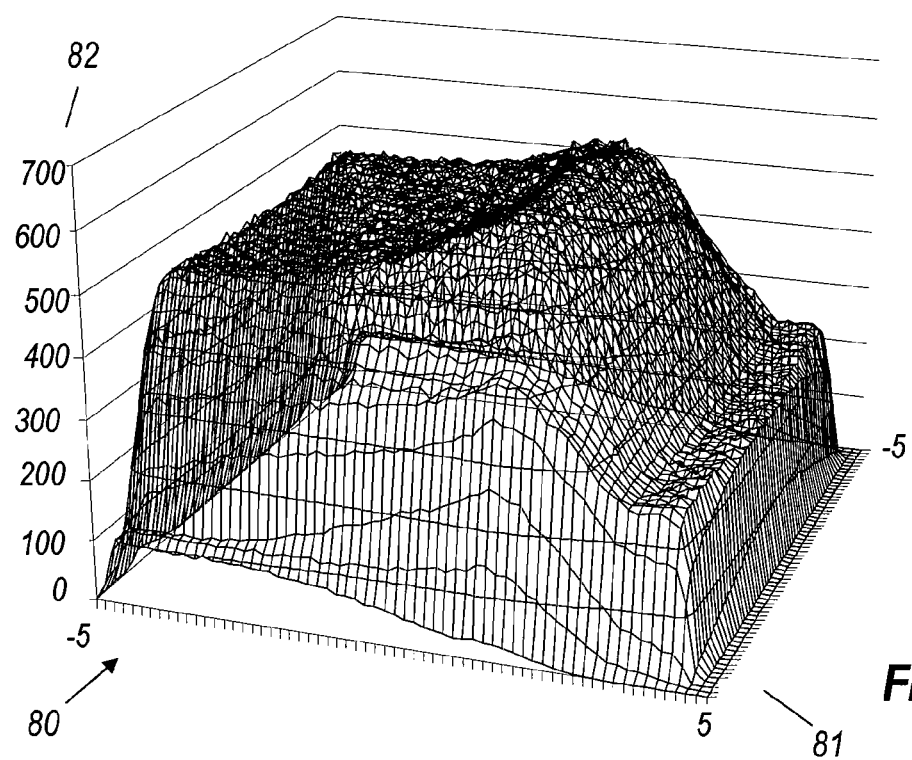
FIG. 8 is a flux plot similar to FIG. 7, for 0.7° tracking error.

FIG. 6 to FIG. 8 show further details on the optical performance of the device shown in FIG. 9. FIG. 6 shows graph 60 with abscissa 61 plotting off-axis angle and ordinate 62 plotting relative transmission of the Fresnel-R Köhler in FIG. 9. Dotted curve 63 is for a section parallel to the diagonal of the cell and solid line 64 for a section parallel to two sides of the cell. Vertical dashed line 65 corresponds to 1.47° and horizontal dashed line 66 corresponds to the 90% threshold. The spectral dependence of the optical performance (optical efficiency, acceptance angle and irradiance distribution) is very small (acceptance angle drops to 1.43° for a polychromatic ray trace within the spectrum of the top junction of commercially available tandem cells).

The irradiance on the cell has excellent uniformity. FIG. 7 is a perspective view of 3D graph 70, with base 71 displaying in millimeters the two spatial dimensions on the 1 cm² cell and vertical axis 72 showing the intensity in suns. The high uniformity of the irradiation is clear. The peak irradiance is 450 suns at direction normal incidence (DNI) of 850 W/m². This is well below the current 1,500 sun upper limit for present high-efficiency tandem solar cells.

FIG. 8 shows graph 80 with planar base 81 displaying in millimeters the two spatial dimensions on the 1 cm² cell, and vertical axis 82 reading in suns of concentration. The graph 80 shows the irradiance distribution on the cell when the concentrator has a tracking error of 1°. The irradiance peak is 635 suns which is still acceptable for the cell performance.

Figures 10A, 10B:
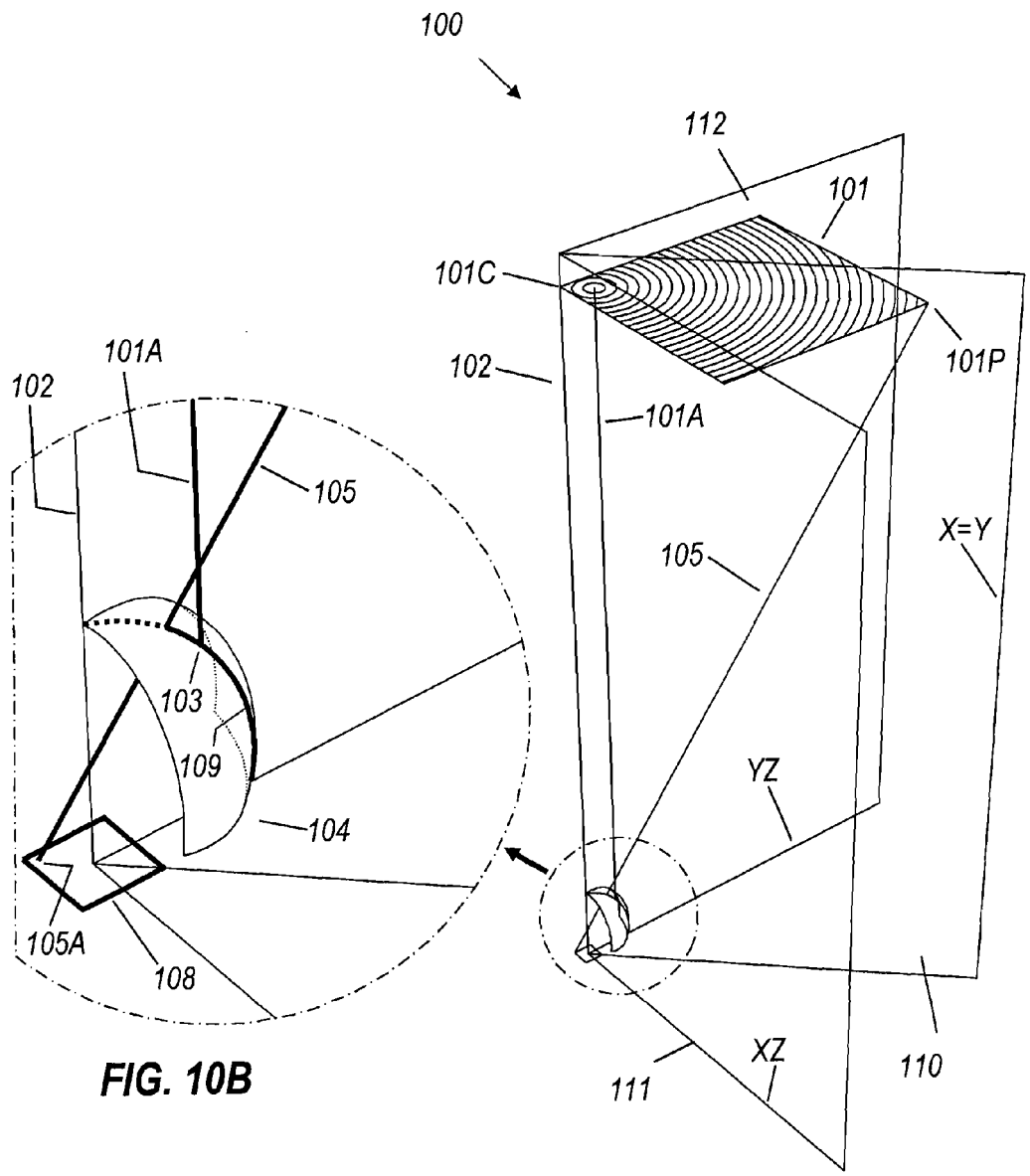
FIG. 10A is a perspective view of one of the four subsystems of the concentrator shown in FIG. 9.
FIG. 10B is an enlarged detail of FIG. 10A.
Figure 11A:
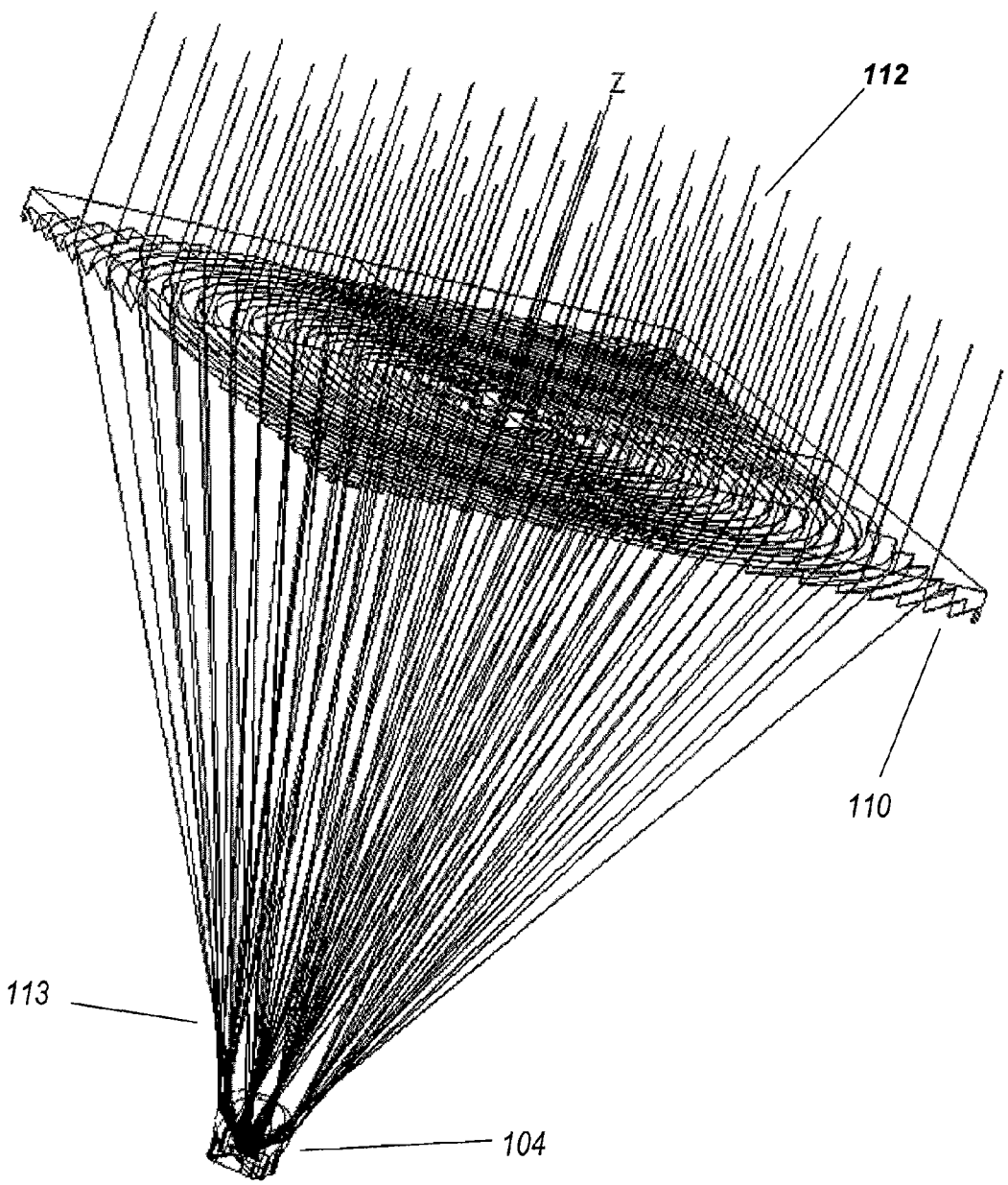
FIG. 11A is a side view of the ray-paths of quad-lenticulated RR Köhler concentrator.
Figure 11B:
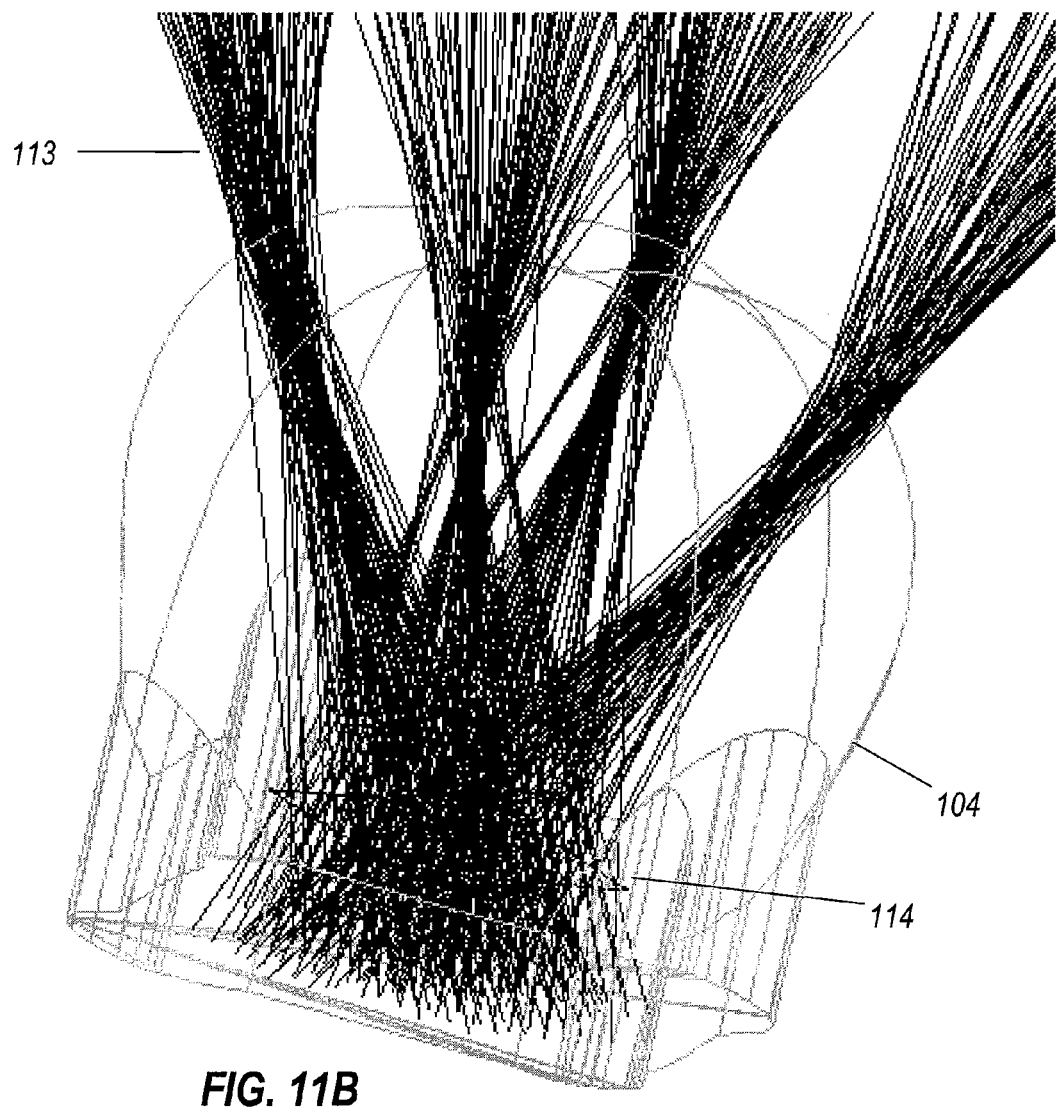
FIG. 11B is a close-up view of the same at the secondary lens.

Details of the design of the Fresnel-R Kohler design of FIG. 9 are shown in FIGS. 10A and 10B and in more detail in FIG. 11A, and especially in FIG. 11B. (FIGS. 10B and 11B are enlarged details of the secondary lens vicinity of FIGS. 10A and 11A, respectively.) each of the four lenticular panels 101 of the Fresnel lens 110 images the incoming sunlight onto a corresponding one of four lenslets or segments 104 of the secondary lens. Each lenslet 104 of the secondary lens 111 images the associated square segment 101 of the Fresnel lens onto the square photovoltaic cell 108. The sunlight incident on each panel of the Fresnel lens is thus spread fairly evenly over the entire extent of the photovoltaic cell 108. Any unevenness in the distribution is not large, and is at least partially cancelled out because the four segments and lenslets are off-axis, and are rotated relative to one another, so that any hot-spots are shared over four different parts of the cell.

FIGS. 9 to 11B show a particular embodiment, which comprises a Fresnel-type lens as a primary optical element, a lens as a secondary optical element, and a photovoltaic receiver. The photovoltaic receiver has preferably a square, flat active area, and without loss of generality can be considered located in a coordinate system defined so that the receiver plane is z=0 and the two sides are parallel to the x-y axes. The primary optical element is composed by four units (lenslets or segments), each one covering one quadrant of the x-y coordinates. Preferably, the four units are symmetrical mirror images with respect to the x=0 and y=0 planes, and thus defining the unit in the region x>0, y>0 fully defines the primary optical element. The secondary optical element then preferably has four lenslets with the same symmetry, and there is a one-to-one correspondence between the primary and secondary optical lenslets so they are Köhler integration pairs, as described in the patent application WO 2007/016363.

In the particular embodiment shown in FIGS. 9 to 11, the lenslet of the primary optical element in region x>0, y>0 and the lenslet of the secondary optical element in region x>0, y>0 are a Köhler pair, and similarly for the other three quadrants, but other correspondences are obviously possible. The primary optical element 110 can be a flat Fresnel lens located in a plane parallel to the z=0 plane. Within each Köhler pair, the primary Fresnel section or lenslet 101 x>0, y>0, etc., forming part of the POE 110, will form an image of the sun on the respective secondary optical element lenslet or unit 104 of that pair, while the secondary unit will form an image of the associated primary optical element pair unit on the solar cell. Each of the four Fresnel sub-lenses can have a rotationally symmetrical optical surface. The optical profiles of the four rotationally symmetric Fresnel lenses are then arranged in such a way that the four axes of rotational symmetry are parallel but do not coincide with each other, nor with the center of the overall optical system, resulting in the "clover leaf" pattern already mentioned and shown in FIG. 9. The focal planes of the Fresnel lenses are then located close to the z position apertures of the second optical elements.

The size of the primary optics units is given by the image of the photovoltaic receiver, while the size of the secondary optics units is defined by the image of the acceptance solid angle (that is, the solid angle of the sky of angular radius α occupied by the sun (angular radius $α_s$) plus the tolerance added to it by the designer).

This optical arrangement produces a rather uniform illumination of the photovoltaic receiver, since each secondary lens is imaging its corresponding primary lens, which is uniformly illuminated by the sun, onto the receiver. Such uniform illumination is desirable for solar cells.

FIGS. 11A and 11B show how the parallel rays 113 from the center of the sun (when it is perfectly tracked) will be focused by the four units 101 of the primary lens 110 onto the four images 114 on the four units of the secondary lens 111.

In FIG. 11B the secondary lens slope at the edge is such that the lens could not be manufactured by glass molding with a single-sided mold. However, the draft-angle requirement for molding can be set at the design stage.

FIG. 10A shows one of the four square sub-lenses 101, each of which has circular symmetry around vertical axis 101A. Axis 101A passes through the optical center of the sub-lens 101, and is parallel to the Z-axis 102 of the whole concentrator 100. Lens 101 has focus 103 where axis 101A meets the secondary optic 104. Alternatively, the focus can be located deeper inside the glass, closer to the point of intersection of line 101A and the straight line joining the edge points of meridional curve 109 on the surface of SOE 104. A repeated 90° rotation about axis 102 or corresponding reflection in the XZ and YZ vertical planes shown in FIG. 10A generates the other three segments. For convenient description, line 113 is taken as the Z axis, and the bottom edges of the shown panels of planes 111 and 112 as the X and Y axes. Only the X>0, Y>0 optical unit is described in detail; the same description applies to the other three quadrant units with corresponding changes in the signs of coordinates.

The secondary optic 104 also has four lenslets and its overall shape is shown in FIG. 11B. The lenslet shown in FIG. 10B has circular symmetry about tilted axis 105, which lies in the X=Y plane 110, and connects far edge point 101P of Fresnel lens 101 with the opposite far edge point 105A of receiver 108. The secondary is then obtained by making curve 109, contained in the X=Y plane 110, as the Cartesian oval curve focusing point 101P onto point 105A. Point 105A may be at the edge of the receiver or it may be at some other point (inside or outside the receiver). In the interests of clarity, only the half of lenslet 104 behind the X=Y plane is shown, so that the meridional generating curve 109 appears as an edge of the shown half lenslet. The Cartesian coordinates have the X and Y axes along the bottom edges of the XZ and YZ vertical planes, and the Z axis is the vertical line 102, so that the photovoltaic cell or other receiver 108 lies in the XY plane and is centered at the origin. In Table 1, the receiver 108 has dimensions 8.8×8.8. The line 101A that is the axis of symmetry of the Fresnel lens 101 is parallel to the Z axis, at X=Y=10.6066. (The size of the units is arbitrary.) The endpoints of the line 105 that is the axis of rotation of curve 109 to form the secondary optical surface have the coordinates:

TABLE 1

| Point | X | Y | Z |
|-------|------|------|-----|
| 105A  | −5.9 | −5.9 | 0   |
| 101P  | 113  | 113  | 384 |

Lower endpoint 105A can alternatively be placed outside the receiver 108. The lens 101 quadrant is then imaged onto an area larger than receiver chip 108. That ensures full irradiation over the whole area of receiver chip 108, at the expense of some wasted illumination, or can accommodates a practical solar collector in which the outer edge of Fresnel lens 101 is shadowed by a mounting structure.

The curve 109 in the X=Y plane 110 may be traced through the points listed in Table 2 (placed at the end of the description). Since X=Y, a single value has been given that is both the X coordinate value and the Y coordinate value for each point. The surface of secondary lens 104 is then generated by rotating curve 109 about axis 105.

The profile of the Fresnel lens 101, in section in the X=Y plane 110, may be traced through the points, listed in Table 3 (placed at the end of the description), that run from the corner 101C where the lens meets the Z axis 102 to the corner 101P where the lens meets the axis 105 of rotation of the secondary optical element curve 109. Because lens 101 is rotationally symmetric about central axis 101A, the part of this profile between the axis 101A and Z-axis 102 is a mirror image of the next part. However, for ease of reference the whole profile is included in the table. If it is desired to convert the profile into cylindrical polar coordinates centered on the optical axis 101A of one lenslet for manufacturing purposes, the duplicated part of the profile may be discarded.

Figure 13:
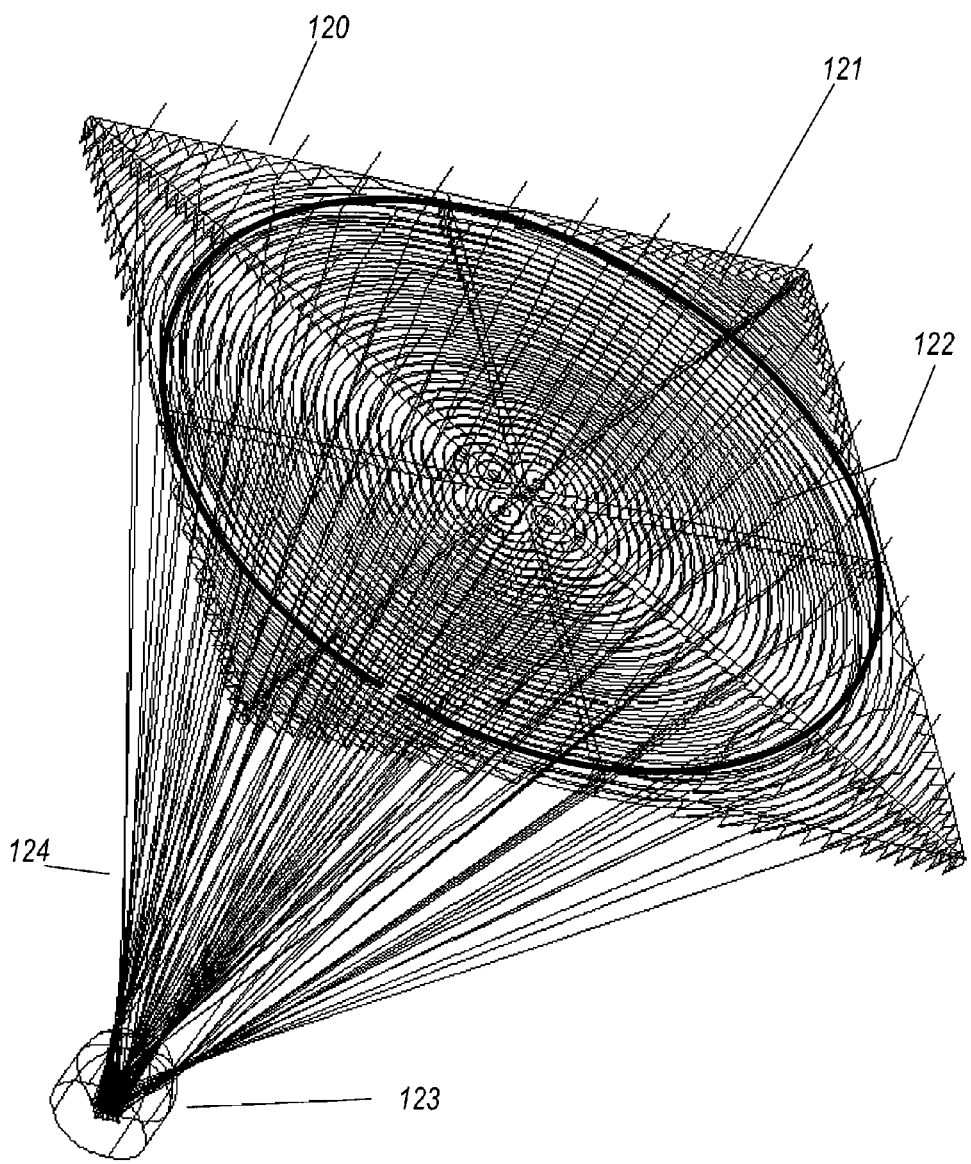
FIG. 13 is a perspective view of the same showing the ray-paths through the components of the concentrator.
Figure 14:
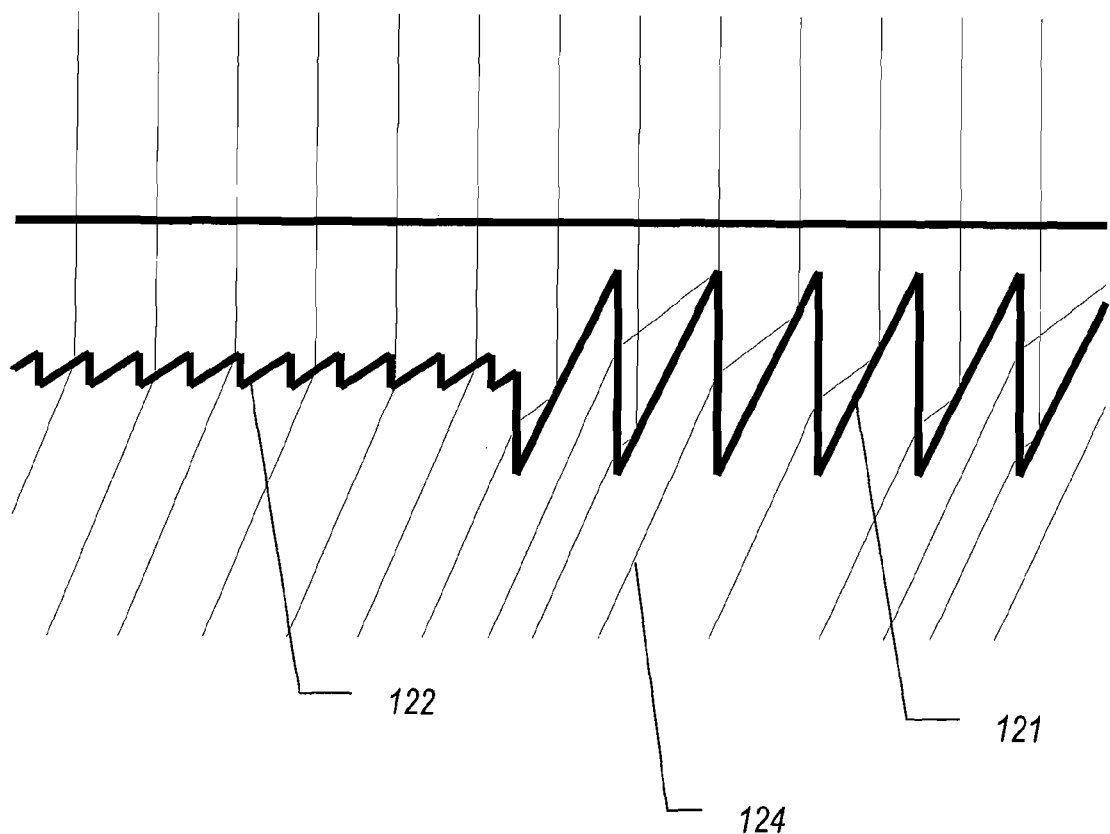
FIG. 14 is a sectional view of the primary optic of the same which shows the Fresnel and TIR facets.

FIG. 12 shows another embodiment of a four-lenslet concentrator comprising secondary optical element 123 and a Total Internal Reflection (TIR) lens 120 as primary optical element. The TIR lens comprises conventional Fresnel facets 122 in its central portion and TIR facets 121 in the outer portion. In TIR facets the rays suffer one Total Internal Reflection and one refraction, as shown in the sectional view of FIG. 14. Previous proposals for a TIR lens with a refractive secondary applied to CPV systems can be found in U.S. Pat. No. 7,160,522 and references therein, and in Reference [15]. In contrast to the embodiment of FIGS. 12-14, no Köhler integration is used for homogenization in those previously proposed devices. FIG. 13 shows rays 124 traced through the device for the sun on-axis, and as designed, four focal regions are formed at the entry of quad-symmetry secondary optical element 132.

Thus, using the Kohler integration concept, the irradiance on the solar cell can be kept at low levels in order to guarantee proper cell performance. Embodiments of the present invention are related to the field of photovoltaic concentrators and solid state lighting. The present embodiments are a particular realization of the devices described in the above-mentioned patent application WO 2007/016363 to Miñano et al.

Variations can be obtained by designers skilled in the art. For instance, the number of lenslets on the secondary optical element can be increased, for instance, to nine. Then the number of lenslets in the primary optics will increase to nine accordingly. Also the cell can be not square but rectangular, and then the four units of the Fresnel lens will preferably be correspondingly rectangular, so that each Fresnel lens unit still images easily onto the photovoltaic cell. Alternatively, or in addition, the number of Fresnel lenslets could be reduced to two, or could be another number that is not a square, so that the overall Fresnel lens is a differently shaped rectangle from the photovoltaic cell. The desirable number of lenslets in each primary and secondary lens segment may depend on the actual size of the device, as affecting the resulting size and precision of manufacture of the lens features.

Although various specific embodiments have been shown and described, the skilled reader will understand how features of different embodiments may be combined in a single photovoltaic collector, luminaire, or other device to form other devices within the scope of the present invention.

The skilled reader will also understand how various alternatives and modifications may be made within the scope of the present invention. For example, the embodiments have been described as applied to solar concentrators, and have been designed with an acceptance radius or acceptance half-angle $\alpha$ in consideration of the apparent size of the sun as seen from earth (radius $\alpha_s$ approximately)¼°) plus a reasonable allowance for tracking errors in aiming a concentrator at the sun. The skilled reader will understand how to apply the same geometry to collimators as well as concentrators, and how to produce devices with different acceptance angles (beam angles in collimators). A device as shown in any of FIGS. 4A to 5 or FIGS. 9-11B with a light source, such as an LED or an array of LEDs, at 43 or 108 would act as a luminaire producing a narrowly collimated output beam perpendicular to the primary optical element. Assuming that the light source illuminates the entire interior of the active surface area of the secondary lens, the collimated output beam will correspond, at least approximately, to the acceptance $a$ of the photovoltaic concentrator.

When the photovoltaic cell is replaced by an LED or an LED array, the present embodiments provide optical devices that can collimate the light with a quite uniform intensity for the directions of emission, because all points on the source are carried to every direction. This can be used to mix the colors of different LEDs of a source array or to make the intensity of the emission more uniform without the need to bin the chips.

The preceding description of the presently contemplated best mode of practicing the invention is not to be taken in a limiting sense, but is made merely for the purpose of describing the general principles of the invention. The full scope of the invention should be determined with reference to the claims.

TABLE 2

| X = Y | Z |
|---|---|
| 6.715102381 | 40.90886008 |
| 6.761715865 | 40.89145456 |
| 6.808218888 | 40.87374061 |
| 6.854611786 | 40.8557188 |
| 6.900894887 | 40.83738967 |
| 6.947068513 | 40.81875376 |
| 6.993132984 | 40.79981159 |
| 7.039088611 | 40.78056365 |
| 7.084935702 | 40.76101042 |
| 7.130674559 | 40.74115238 |
| 7.176305478 | 40.72098997 |
| 7.22182875 | 40.70052364 |
| 7.267244663 | 40.67975381 |
| 7.312553496 | 40.65868088 |
| 7.357755526 | 40.63730524 |
| 7.402851025 | 40.61562727 |
| 7.447840258 | 40.59364732 |
| 7.492723486 | 40.57136576 |
| 7.537500966 | 40.5487829 |
| 7.582172948 | 40.52589906 |
| 7.626739679 | 40.50271454 |
| 7.671201401 | 40.47922963 |
| 7.71555835 | 40.45544461 |
| 7.759810759 | 40.43135972 |
| 7.803958854 | 40.40697521 |
| 7.848002858 | 40.38229132 |
| 7.891942988 | 40.35730824 |
| 7.935779459 | 40.33202619 |
| 7.979512478 | 40.30644535 |
| 8.023142249 | 40.28056588 |
| 8.066668972 | 40.25438794 |
| 8.11009284 | 40.22791168 |
| 8.153414045 | 40.20113723 |
| 8.196632772 | 40.17406469 |
| 8.239749201 | 40.14669416 |
| 8.28276351 | 40.11902574 |
| 8.32567587 | 40.09105949 |
| 8.36848645 | 40.06279547 |
| 8.411195411 | 40.03423372 |
| 8.453802913 | 40.00537427 |
| 8.49630911 | 39.97621714 |
| 8.538714152 | 39.94676232 |
| 8.581018184 | 39.9170098 |
| 8.623221346 | 39.88695956 |
| 8.665323777 | 39.85661155 |
| 8.707325608 | 39.82596571 |
| 8.749226966 | 39.79502199 |
| 8.791027975 | 39.76378028 |
| 8.832728755 | 39.73224049 |
| 8.874329419 | 39.70040252 |
| 8.915830079 | 39.66826623 |
| 8.95723084 | 39.63583148 |
| 8.998531804 | 39.60309812 |

TABLE 2-continued

| X = Y | Z |
|---|---|
| 9.039733068 | 39.57006597 |
| 9.080834725 | 39.53673486 |
| 9.121836863 | 39.50310458 |
| 9.162739568 | 39.46917492 |
| 9.203542918 | 39.43494566 |
| 9.244246989 | 39.40041655 |
| 9.284851853 | 39.36558733 |
| 9.325357575 | 39.33045774 |
| 9.365764219 | 39.29502749 |
| 9.406071842 | 39.25929627 |
| 9.446280497 | 39.22326378 |
| 9.486390234 | 39.18692968 |
| 9.526401098 | 39.15029363 |
| 9.566313129 | 39.11335526 |
| 9.606126362 | 39.07611421 |
| 9.645840829 | 39.03857007 |
| 9.685456557 | 39.00072245 |
| 9.724973568 | 38.96257092 |
| 9.764391881 | 38.92411505 |
| 9.803711508 | 38.88535438 |
| 9.842932458 | 38.84628845 |
| 9.882054735 | 38.80691677 |
| 9.92107834 | 38.76723885 |
| 9.960003267 | 38.72725416 |
| 9.998829507 | 38.68696217 |
| 10.03755705 | 38.64636235 |
| 10.07618586 | 38.60545411 |
| 10.11471594 | 38.56423689 |
| 10.15314724 | 38.52271009 |
| 10.19147974 | 38.48087308 |
| 10.22971339 | 38.43872525 |
| 10.26784816 | 38.39626593 |
| 10.30588399 | 38.35349447 |
| 10.34382084 | 38.31041019 |
| 10.38165864 | 38.26701238 |
| 10.41939734 | 38.22330032 |
| 10.45703687 | 38.17927329 |
| 10.49457715 | 38.13493052 |
| 10.53201811 | 38.09027124 |
| 10.56935966 | 38.04529467 |
| 10.60660172 | 38 |
| 10.64384001 | 37.95470991 |
| 10.68097882 | 37.90910103 |
| 10.71801805 | 37.86317253 |
| 10.75495759 | 37.81692354 |
| 10.79179735 | 37.77035319 |
| 10.82853721 | 37.72346058 |
| 10.86517704 | 37.67624479 |
| 10.90171673 | 37.62870488 |
| 10.93815616 | 37.58083989 |
| 10.97449517 | 37.53264885 |
| 11.01073364 | 37.48413076 |
| 11.04687141 | 37.43528458 |
| 11.08290835 | 37.3861093 |
| 11.11884428 | 37.33660383 |
| 11.15467905 | 37.2867671 |
| 11.19041249 | 37.23659799 |
| 11.22604441 | 37.18609539 |
| 11.26157465 | 37.13525814 |
| 11.29700301 | 37.08408506 |
| 11.3323293 | 37.03257495 |
| 11.36755332 | 36.9807266 |
| 11.40267487 | 36.92853877 |
| 11.43769372 | 36.87601017 |
| 11.47260966 | 36.82313952 |
| 11.50742247 | 36.7699255 |
| 11.54213191 | 36.71636676 |
| 11.57673774 | 36.66246194 |
| 11.61123972 | 36.60820964 |
| 11.64563758 | 36.55360843 |
| 11.67993108 | 36.49865688 |
| 11.71411994 | 36.4433535 |
| 11.74820389 | 36.38769679 |
| 11.78218264 | 36.33168522 |
| 11.81605591 | 36.27531722 |
| 11.84982339 | 36.21859122 |
| 11.88348479 | 36.16150558 |
| 11.91703978 | 36.10405867 |
| 11.95048804 | 36.04624879 |
| 11.98382925 | 35.98807425 |
| 12.01706306 | 35.9295333 |
| 12.05018914 | 35.87062417 |
| 12.08320712 | 35.81134505 |
| 12.11611664 | 35.75169409 |
| 12.14891733 | 35.69166944 |
| 12.1816088 | 35.63126917 |
| 12.21419067 | 35.57049136 |
| 12.24666254 | 35.50933401 |
| 12.27902399 | 35.44779511 |
| 12.3112746 | 35.38587262 |
| 12.34341395 | 35.32356444 |
| 12.3754416 | 35.26086844 |
| 12.4073571 | 35.19778247 |
| 12.43915998 | 35.1343043 |
| 12.47084978 | 35.0704317 |
| 12.50242601 | 35.00616238 |
| 12.53388819 | 34.941494 |
| 12.56523581 | 34.87642419 |
| 12.59646835 | 34.81095053 |
| 12.62758529 | 34.74507056 |
| 12.65858609 | 34.67878177 |
| 12.68947019 | 34.61208161 |
| 12.72023705 | 34.54496746 |
| 12.75088607 | 34.47743668 |
| 12.78141667 | 34.40948657 |
| 12.81182826 | 34.34111437 |
| 12.8421202 | 34.27231728 |
| 12.87229188 | 34.20309244 |
| 12.90234265 | 34.13343693 |
| 12.93227186 | 34.0633478 |
| 12.96207883 | 33.992822 |
| 12.99176287 | 33.92185647 |
| 13.02132328 | 33.85044806 |
| 13.05075935 | 33.77859357 |
| 13.08007034 | 33.70628973 |
| 13.10925549 | 33.63353321 |
| 13.13831404 | 33.56032061 |
| 13.16724522 | 33.48664849 |
| 13.1960482 | 33.41251331 |
| 13.22472217 | 33.33791146 |
| 13.2532663 | 33.26283929 |
| 13.28167973 | 33.18729304 |
| 13.30996157 | 33.11126891 |
| 13.33811093 | 33.03476298 |
| 13.3661269 | 32.95777129 |
| 13.39400853 | 32.88028977 |
| 13.42175486 | 32.8023143 |
| 13.44936491 | 32.72384064 |
| 13.47683768 | 32.64486448 |
| 13.50417214 | 32.56538141 |
| 13.53136724 | 32.48538695 |
| 13.55842189 | 32.4048765 |
| 13.585335 | 32.32384538 |
| 13.61210544 | 32.24228878 |
| 13.63873205 | 32.16020184 |
| 13.66521366 | 32.07757954 |
| 13.69154906 | 31.99441678 |
| 13.717737 | 31.91070835 |
| 13.74377622 | 31.8264489 |
| 13.76966542 | 31.741633 |
| 13.79540327 | 31.65625505 |
| 13.82098841 | 31.57030938 |
| 13.84641943 | 31.48379014 |
| 13.87169492 | 31.39669137 |
| 13.8968134 | 31.30900698 |
| 13.92177337 | 31.22073071 |
| 13.94657329 | 31.1318562 |
| 13.97121158 | 31.04237688 |
| 13.99568663 | 30.95228608 |
| 14.01999676 | 30.86157694 |
| 14.04414028 | 30.77024244 |
| 14.06811545 | 30.67827538 |
| 14.09192046 | 30.5856684 |
| 14.11555347 | 30.49241395 |
| 14.1390126 | 30.39850429 |
| 14.16229591 | 30.30393148 |

TABLE 2-continued

| X = Y | Z |
| --- | --- |
| 14.1854014 | 30.20868739 |
| 14.20832703 | 30.11276367 |
| 14.23107069 | 30.01615176 |
| 14.25363023 | 29.91884287 |
| 14.27600342 | 29.82082799 |
| 14.29818798 | 29.72209786 |
| 14.32018157 | 29.62264296 |
| 14.34198177 | 29.52245353 |
| 14.3635861 | 29.42151954 |
| 14.384992 | 29.31983067 |
| 14.40619683 | 29.21737632 |
| 14.4271979 | 29.11414557 |
| 14.44799242 | 29.01012723 |
| 14.4685775 | 28.90530974 |
| 14.48895019 | 28.79968122 |
| 14.50910743 | 28.69322944 |
| 14.52904608 | 28.58594181 |
| 14.54876288 | 28.47780534 |
| 14.5682545 | 28.36880666 |
| 14.58751747 | 28.25893197 |
| 14.60654822 | 28.14816705 |
| 14.62534306 | 28.03649722 |
| 14.64389819 | 27.92390734 |
| 14.66220966 | 27.81038174 |
| 14.6802734 | 27.69590428 |
| 14.6980852 | 27.58045826 |
| 14.7156407 | 27.46402641 |
| 14.73293538 | 27.34659087 |
| 14.74996457 | 27.22813316 |
| 14.76672342 | 27.10863416 |
| 14.78320691 | 26.98807404 |
| 14.79940983 | 26.86643227 |
| 14.81532676 | 26.74368756 |
| 14.8309521 | 26.61981783 |
| 14.84628001 | 26.49480015 |
| 14.86130443 | 26.36861071 |
| 14.87601905 | 26.24122479 |
| 14.89041731 | 26.11261667 |
| 14.90449237 | 25.98275959 |
| 14.91823712 | 25.85162569 |
| 14.93164414 | 25.71918598 |
| 14.94470568 | 25.5854102 |
| 14.95741366 | 25.45026682 |
| 14.96975963 | 25.31372289 |
| 14.98173477 | 25.17574403 |
| 14.99332983 | 25.03629427 |
| 15.00453515 | 24.89533597 |
| 15.01534057 | 24.75282974 |
| 15.02573548 | 24.60873428 |
| 15.0357087 | 24.46300626 |
| 15.0452485 | 24.31560018 |
| 15.05434254 | 24.16646823 |
| 15.06297782 | 24.0155601 |
| 15.07114065 | 23.8628228 |
| 15.07881658 | 23.70820046 |
| 15.08599034 | 23.55163409 |
| 15.09264578 | 23.39306137 |
| 15.0987658 | 23.23241633 |
| 15.10433227 | 23.06962905 |
| 15.10932593 | 22.90462536 |
| 15.11372629 | 22.73732644 |
| 15.11751157 | 22.56764839 |
| 15.12065848 | 22.39550179 |
| 15.12314218 | 22.22079114 |
| 15.12493606 | 22.04341428 |
| 15.12601157 | 21.86326174 |
| 15.12633805 | 21.68021596 |
| 15.12588249 | 21.49415041 |
| 15.12460925 | 21.30492864 |
| 15.12247977 | 21.11240313 |
| 15.11945225 | 20.91641399 |
| 15.11548121 | 20.71678744 |
| 15.11051707 | 20.51333409 |
| 15.10450558 | 20.30584689 |
| 15.09738719 | 20.09409869 |
| 15.08909633 | 19.87783945 |
| 15.07956047 | 19.65679284 |
| 15.06869906 | 19.4306522 |

TABLE 2-continued

| X = Y | Z |
| --- | --- |
| 15.0564223 | 19.19907568 |
| 15.04262946 | 18.96168027 |
| 15.02720705 | 18.71803453 |
| 15.01002639 | 18.4676496 |
| 14.99094061 | 18.20996781 |
| 14.96978083 | 17.9443484 |
| 14.94635135 | 17.67004908 |
| 14.92042321 | 17.386202 |
| 14.89172578 | 17.09178194 |
| 14.85993539 | 16.78556333 |
| 14.82465956 | 16.46606096 |
| 14.78541481 | 16.13144615 |
| 14.74159427 | 15.77942477 |
| 14.69241898 | 15.40705364 |
| 14.63686143 | 15.01045256 |
| 14.57351959 | 14.58432968 |
| 14.5003958 | 14.12114876 |
| 14.41447609 | 13.60954515 |
| 14.31083809 | 13.03096736 |
| 14.18044212 | 12.35136262 |
| 14.00316009 | 11.49494283 |
| 13.71314188 | 10.21387196 |
| 12.35782987 | 4.924505961 |

TABLE 3

| X = Y | Z |
| --- | --- |
| 0 | 385 |
| 113 | 385 |
| 113 | 384 |
| 112.7835316 | 383.6637392 |
| 112.7835316 | 384.3348376 |
| 112.0764248 | 383.6651624 |
| 112.0764248 | 384.3334016 |
| 111.369318 | 383.6665984 |
| 111.369318 | 384.3319525 |
| 110.6622113 | 383.6680475 |
| 110.6622113 | 384.3304904 |
| 109.9551045 | 383.6695096 |
| 109.9551045 | 384.3290152 |
| 109.2479977 | 383.6709848 |
| 109.2479977 | 384.3275268 |
| 108.5408909 | 383.6724732 |
| 108.5408909 | 384.3260253 |
| 107.8337841 | 383.6739747 |
| 107.8337841 | 384.3245105 |
| 107.1266773 | 383.6754895 |
| 107.1266773 | 384.3229824 |
| 106.4195706 | 383.6770176 |
| 106.4195706 | 384.3214409 |
| 105.7124638 | 383.6785591 |
| 105.7124638 | 384.3198861 |
| 105.005357 | 383.6801139 |
| 105.005357 | 384.3183179 |
| 104.2982502 | 383.6816821 |
| 104.2982502 | 384.3167362 |
| 103.5911434 | 383.6832638 |
| 103.5911434 | 384.315141 |
| 102.8840367 | 383.684859 |
| 102.8840367 | 384.3135323 |
| 102.1769299 | 383.6864677 |
| 102.1769299 | 384.31191 |
| 101.4698231 | 383.68809 |
| 101.4698231 | 384.3102741 |
| 100.7627163 | 383.6897259 |
| 100.7627163 | 384.3086245 |
| 100.0556095 | 383.6913755 |
| 100.0556095 | 384.3069613 |
| 99.34850276 | 383.6930387 |
| 99.34850276 | 384.3052844 |
| 98.64139598 | 383.6947156 |
| 98.64139598 | 384.3035937 |
| 97.93428919 | 383.6964063 |
| 97.93428919 | 384.3018893 |

TABLE 3-continued

| X = Y | Z |
|---|---|
| 97.22718241 | 383.6981107 |
| 97.22718241 | 384.3001711 |
| 96.52007563 | 383.6998289 |
| 96.52007563 | 384.298439 |
| 95.81296885 | 383.701561 |
| 95.81296885 | 384.2966932 |
| 95.10586207 | 383.7033068 |
| 95.10586207 | 384.2949335 |
| 94.39875529 | 383.7050665 |
| 94.39875529 | 384.2931599 |
| 93.69164851 | 383.7068401 |
| 93.69164851 | 384.2913724 |
| 92.98454173 | 383.7086276 |
| 92.98454173 | 384.289571 |
| 92.27743494 | 383.710429 |
| 92.27743494 | 384.2877557 |
| 91.57032816 | 383.7122443 |
| 91.57032816 | 384.2859264 |
| 90.86322138 | 383.7140736 |
| 90.86322138 | 384.2840832 |
| 90.1561146 | 383.7159168 |
| 90.1561146 | 384.2822261 |
| 89.44900782 | 383.7177739 |
| 89.44900782 | 384.280355 |
| 88.74190104 | 383.719645 |
| 88.74190104 | 384.2784699 |
| 88.03479426 | 383.7215301 |
| 88.03479426 | 384.2765708 |
| 87.32768748 | 383.7234292 |
| 87.32768748 | 384.2746578 |
| 86.6205807 | 383.7253422 |
| 86.6205807 | 384.2727308 |
| 85.91347391 | 383.7272692 |
| 85.91347391 | 384.2707898 |
| 85.20636713 | 383.7292102 |
| 85.20636713 | 384.2688349 |
| 84.49926035 | 383.7311651 |
| 84.49926035 | 384.266866 |
| 83.79215357 | 383.733134 |
| 83.79215357 | 384.2648832 |
| 83.08504679 | 383.7351168 |
| 83.08504679 | 384.2628865 |
| 82.37794001 | 383.7371135 |
| 82.37794001 | 384.2608758 |
| 81.67083323 | 383.7391242 |
| 81.67083323 | 384.2588513 |
| 80.96372645 | 383.7411487 |
| 80.96372645 | 384.2568128 |
| 80.25661966 | 383.7431872 |
| 80.25661966 | 384.2547605 |
| 79.54951288 | 383.7452395 |
| 79.54951288 | 384.2526943 |
| 78.8424061 | 383.7473057 |
| 78.8424061 | 384.2506144 |
| 78.13529932 | 383.7493856 |
| 78.13529932 | 384.2485206 |
| 77.42819254 | 383.7514794 |
| 77.42819254 | 384.2464131 |
| 76.72108576 | 383.7535869 |
| 76.72108576 | 384.2442919 |
| 76.01397898 | 383.7557081 |
| 76.01397898 | 384.2421569 |
| 75.3068722 | 383.7578431 |
| 75.3068722 | 384.2400084 |
| 74.59976542 | 383.7599916 |
| 74.59976542 | 384.2378462 |
| 73.89265863 | 383.7621538 |
| 73.89265863 | 384.2356704 |
| 73.18555185 | 383.7643296 |
| 73.18555185 | 384.2334811 |
| 72.47844507 | 383.7665189 |
| 72.47844507 | 384.2312784 |
| 71.77133829 | 383.7687216 |
| 71.77133829 | 384.2290622 |
| 71.06423151 | 383.7709378 |
| 71.06423151 | 384.2268326 |
| 70.35712473 | 383.7731674 |
| 70.35712473 | 384.2245897 |

TABLE 3-continued

| X = Y | Z |
|---|---|
| 69.65001795 | 383.7754103 |
| 69.65001795 | 384.2223335 |
| 68.94291117 | 383.7776665 |
| 68.94291117 | 384.2200642 |
| 68.23580438 | 383.7799358 |
| 68.23580438 | 384.2177817 |
| 67.5286976 | 383.7822183 |
| 67.5286976 | 384.2154861 |
| 66.82159082 | 383.7845139 |
| 66.82159082 | 384.2131775 |
| 66.11448404 | 383.7868225 |
| 66.11448404 | 384.210856 |
| 65.40737726 | 383.789144 |
| 65.40737726 | 384.2085216 |
| 64.70027048 | 383.7914784 |
| 64.70027048 | 384.2061744 |
| 63.9931637 | 383.7938256 |
| 63.9931637 | 384.2038145 |
| 63.28605692 | 383.7961855 |
| 63.28605692 | 384.2014419 |
| 62.57895014 | 383.7985581 |
| 62.57895014 | 384.1990569 |
| 61.87184335 | 383.8009431 |
| 61.87184335 | 384.1966593 |
| 61.16473657 | 383.8033407 |
| 61.16473657 | 384.1942494 |
| 60.45762979 | 383.8057506 |
| 60.45762979 | 384.1918272 |
| 59.75052301 | 383.8081728 |
| 59.75052301 | 384.1893929 |
| 59.04341623 | 383.8106071 |
| 59.04341623 | 384.1869464 |
| 58.33630945 | 383.8130536 |
| 58.33630945 | 384.184488 |
| 57.62920267 | 383.815512 |
| 57.62920267 | 384.1820176 |
| 56.92209589 | 383.8179824 |
| 56.92209589 | 384.1795355 |
| 56.2149891 | 383.8204645 |
| 56.2149891 | 384.1770417 |
| 55.50788232 | 383.8229583 |
| 55.50788232 | 384.1745364 |
| 54.80077554 | 383.8254636 |
| 54.80077554 | 384.1720196 |
| 54.09366876 | 383.8279804 |
| 54.09366876 | 384.1694915 |
| 53.38656198 | 383.8305085 |
| 53.38656198 | 384.1669522 |
| 52.6794552 | 383.8330478 |
| 52.6794552 | 384.1644018 |
| 51.97234842 | 383.8355982 |
| 51.97234842 | 384.1618404 |
| 51.26524164 | 383.8381596 |
| 51.26524164 | 384.1592682 |
| 50.55813485 | 383.8407318 |
| 50.55813485 | 384.1566852 |
| 49.85102807 | 383.8433148 |
| 49.85102807 | 384.1540917 |
| 49.14392129 | 383.8459083 |
| 49.14392129 | 384.1514878 |
| 48.43681451 | 383.8485122 |
| 48.43681451 | 384.1488735 |
| 47.72970773 | 383.8511265 |
| 47.72970773 | 384.1462491 |
| 47.02260095 | 383.8537509 |
| 47.02260095 | 384.1436146 |
| 46.31549417 | 383.8563854 |
| 46.31549417 | 384.1409703 |
| 45.60838739 | 383.8590297 |
| 45.60838739 | 384.1383163 |
| 44.90128061 | 383.8616837 |
| 44.90128061 | 384.1356526 |
| 44.19417382 | 383.8643474 |
| 44.19417382 | 384.1329796 |
| 43.48706704 | 383.8670204 |
| 43.48706704 | 384.1302972 |
| 42.77996026 | 383.8697028 |
| 42.77996026 | 384.1276058 |

TABLE 3-continued

| X = Y | Z |
|---|---|
| 42.07285348 | 383.8723942 |
| 42.07285348 | 384.1249054 |
| 41.3657467 | 383.8750946 |
| 41.3657467 | 384.1221962 |
| 40.65863992 | 383.8778038 |
| 40.65863992 | 384.1194783 |
| 39.95153314 | 383.8805217 |
| 39.95153314 | 384.116752 |
| 39.24442636 | 383.883248 |
| 39.24442636 | 384.1140174 |
| 38.53731957 | 383.8859826 |
| 38.53731957 | 384.1112747 |
| 37.83021279 | 383.8887253 |
| 37.83021279 | 384.108524 |
| 37.12310601 | 383.891476 |
| 37.12310601 | 384.1057656 |
| 36.41599923 | 383.8942344 |
| 36.41599923 | 384.1029995 |
| 35.70889245 | 383.8970005 |
| 35.70889245 | 384.1002261 |
| 35.00178567 | 383.8997739 |
| 35.00178567 | 384.0974453 |
| 34.29467889 | 383.9025547 |
| 34.29467889 | 384.0946576 |
| 33.58757211 | 383.9053424 |
| 33.58757211 | 384.091863 |
| 32.88046533 | 383.908137 |
| 32.88046533 | 384.0890616 |
| 32.17335854 | 383.9109384 |
| 32.17335854 | 384.0862538 |
| 31.46625176 | 383.9137462 |
| 31.46625176 | 384.0834397 |
| 30.75914498 | 383.9165603 |
| 30.75914498 | 384.0806195 |
| 30.0520382 | 383.9193805 |
| 30.0520382 | 384.0777934 |
| 29.34493142 | 383.9222066 |
| 29.34493142 | 384.0749615 |
| 28.63782464 | 383.9250385 |
| 28.63782464 | 384.0721241 |
| 27.93071786 | 383.9278759 |
| 27.93071786 | 384.0692814 |
| 27.22361108 | 383.9307186 |
| 27.22361108 | 384.0664336 |
| 26.51650429 | 383.9335664 |
| 26.51650429 | 384.0635809 |
| 25.80939751 | 383.9364191 |
| 25.80939751 | 384.0607234 |
| 25.10229073 | 383.9392766 |
| 25.10229073 | 384.0578615 |
| 24.39518395 | 383.9421385 |
| 24.39518395 | 384.0549952 |
| 23.68807717 | 383.9450048 |
| 23.68807717 | 384.0521248 |
| 22.98097039 | 383.9478752 |
| 22.98097039 | 384.0492506 |
| 22.27386361 | 383.9507494 |
| 22.27386361 | 384.0463726 |
| 21.56675683 | 383.9536274 |
| 21.56675683 | 384.0434912 |
| 20.85965005 | 383.9565088 |
| 20.85965005 | 384.0406066 |
| 20.15254326 | 383.9593934 |
| 20.15254326 | 384.0377189 |
| 19.44543648 | 383.9622811 |
| 19.44543648 | 384.0348284 |
| 18.7383297 | 383.9651716 |
| 18.7383297 | 384.0319352 |
| 18.03122292 | 383.9680648 |
| 18.03122292 | 384.0290397 |
| 17.32411614 | 383.9709603 |
| 17.32411614 | 384.0261419 |
| 16.61700936 | 383.9738581 |
| 16.61700936 | 384.0232422 |
| 15.90990258 | 383.9767578 |
| 15.90990258 | 384.0203408 |
| 15.2027958 | 383.9796592 |
| 15.2027958 | 384.0174378 |
| 14.49568901 | 383.9825622 |
| 14.49568901 | 384.0145335 |
| 13.78858223 | 383.9854665 |
| 13.78858223 | 384.0116281 |
| 13.08147545 | 383.9883719 |
| 13.08147545 | 384.0087219 |
| 12.37436867 | 383.9912781 |
| 12.37436867 | 384.0058149 |
| 11.66726189 | 383.9941851 |
| 11.66726189 | 384.0029076 |
| 10.96015511 | 383.9970924 |
| 10.96015511 | 384 |
| 10.25304833 | 384 |
| 10.25304833 | 383.9970924 |
| 9.545941546 | 384.0029076 |
| 9.545941546 | 383.9941851 |
| 8.838834765 | 384.0058149 |
| 8.838834765 | 383.9912781 |
| 8.131727984 | 384.0087219 |
| 8.131727984 | 383.9883719 |
| 7.424621202 | 384.0116281 |
| 7.424621202 | 383.9854665 |
| 6.717514421 | 384.0145335 |
| 6.717514421 | 383.9825622 |
| 6.01040764 | 384.0174378 |
| 6.01040764 | 383.9796592 |
| 5.303300859 | 384.0203408 |
| 5.303300859 | 383.9767578 |
| 4.596194078 | 384.0232422 |
| 4.596194078 | 383.9738581 |
| 3.889087297 | 384.0261419 |
| 3.889087297 | 383.9709603 |
| 3.181980515 | 384.0290397 |
| 3.181980515 | 383.9680648 |
| 2.474873734 | 384.0319352 |
| 2.474873734 | 383.9651716 |
| 1.767766953 | 384.0348284 |
| 1.767766953 | 383.9622811 |
| 1.060660172 | 384.0377189 |
| 1.060660172 | 383.9593934 |
| 0.353553391 | 384.0406066 |
| 0.353553391 | 383.9565088 |
| 0 | 384 |

REFERENCES

[1] W. Cassarly, "Nonimaging Optics: Concentration and Illumination", in the Handbook of Optics, 2nd ed., pp 2.23-2.42, (McGraw-Hill, New York, 2001)

[2] H. Ries, J. M. Gordon, M. Laxen, "High-flux photovoltaic solar concentrators with Kaleidoscope based optical designs", Solar Energy, Vol. 60, No. 1, pp. 11-16, (1997)

[3] J. J. O'Ghallagher, R. Winston, "Nonimaging solar concentrator with near-uniform irradiance for photovoltaic arrays" in Nonimaging Optics: Maximum Efficiency Light Transfer VI, Roland Winston, Ed., Proc. SPIE 4446, pp. 60-64, (2001)

[4] D. G. Jenkings, "High-uniformity solar concentrators for photovoltaic systems" in Nonimaging Optics Maximum Efficiency Light Transfer VI, Roland Winston, Ed., Proc. SPIE 4446, pp. 52-59, (2001)

[5] http://www.daido.co.jp/english/rd/7503.pdf

[6] Gen 1 of http://www.solfocus.com/

[7] www.sol3g.com

[8] L. W. James, "Use of imaging refractive secondaries in photovoltaic concentrators", SAND 89-7029, Albuquerque, N. Mex., (1989)

[9] Chapter 13, "Next Generation Photovoltaics", (Taylor & Francis, CRC Press, 2003)

[10] R. Winston, J. C. Miñano, P. Benítez, "Nonimaging Optics", (Elsevier-Academic Press, New York, 2005)

[11] J. C. Miñano, P. Benítez, J. C. González, "RX: a nonimaging concentrator", Appl. Opt. 34, pp. 2226-2235, (1995)
[12] P. Benítez, J. C. Miriam, "Ultrahigh-numerical-aperture imaging concentrator", J. Opt. Soc. Am. A, 14, pp. 1988-1997, (1997)
[13] J. C. Miñano, M. Hernandez, P. Benítez, J. Blen, O. Dross, R. Mohedano, A. Santamaría, "Free-form integrator array optics", in Nonimaging Optics and Efficient Illumination Systems II, SPIE Proc., R. Winston & T. J. Koshel ed. (2005)
[14] US and other patents and patent applications: U.S. Pat. No. 6,639,733; U.S. Pat. No. 6,896,381; U.S. Pat. No. 7,152,985; U.S. Pat. No. 7,460,985; WO 2007/016363; US 2009/0071467; US 2008/0223443; US 2008/0316761.
[15] J. L. Alvarez., M. Hernández, Benítez P., Miñano J. C, "TIR-R Concentrator: a new compact high-gain SMS design", Nonimaging optics: maximum efficiency light transfer VI, San Diego, Calif., U.S.A., (2001), published in SPIE Proceedings Vol. 4446, Roland Winston Editor, pp. 32-42.
[16] P. Benítez, A. Cvetkovic, R. Winston, G. Díaz, L. Reed, J. Cisneros, A. Tovar, A. Ritschel, J. Wright, "High-Concentration Mirror-Based Köhler Integrating System for Tandem Solar Cells", 4th World Conference on Photovoltaic Energy Conversion, Hawaii, (2006).
[17] J. Chaves, "Introduction to Nonimaging Optics", CRC Press, 2008, Chapter 17.

What is claimed is:

1. An optical device comprising:
a first optical element having a plurality of segments; and
a second optical element having a plurality of segments;
wherein each of the plurality of segments of the first optical element forms with a respective segment of the second optical element one of a respective plurality of Köhler integrators; and
wherein the plurality of Köhler integrators are arranged to direct light from a common source onto a common target.

2. The optical device of claim 1, wherein the segments of the first optical element are so arranged as to produce substantially coincident images of their respective segments of the second optical element at one of the common source and the common target, and wherein the segments of the second optical element are so arranged as to produce substantially coincident images of their respective segments of the first optical element at the other of the common source and the common target.

3. The optical device of claim 1, wherein one of the first and second optical elements is operative to concentrate or collimate light reaching that element from the common source or being directed by that element onto the common target.

4. The optical device of claim 3, wherein the first and second optical elements are operative to concentrate or collimate light reaching one of those elements from the common source and being directed by the other of those elements onto the common target.

5. The optical element of claim 1, wherein the smaller of the first and second optical elements is a refractive surface on a dielectric element that extends from the refractive surface to the source or target.

6. The optical element of claim 1, wherein the first and second optical elements each comprise four facets symmetrically arranged around a common axis.

7. The optical device of claim 1, further comprising a central axis, wherein the common target further comprises a device for converting light into another form of energy, and wherein each of the plurality of Köhler integrators is arranged to direct collimated light incident parallel to said central axis over the common target.

8. The optical device of claim 7, wherein the device for converting energy is a photovoltaic cell.

9. The optical device of claim 1, wherein the first optical element is an array of Fresnel lens segments, each of which is a Fresnel lens having a distinct center.

10. The optical device of claim 9, wherein each Fresnel lens segment is circularly symmetrical about a center within the segment, and the segments are symmetrically arranged about a center of the first optical element.

11. The optical device of claim 1, wherein the first optical element is an array of TIR lens segments, each of which is a TIR lens having a distinct center.

12. The optical device of claim 1, wherein the first optical element is a mirror, of which each segment is a concave paraboloid having a distinct center.

13. The optical device of claim 1, wherein the second optical element is a dielectric element having the plurality of segments formed in one surface and having the common source or common target at another surface.

14. The optical device of claim 1, wherein the first optical element and the second optical element each comprise four segments arranged 90° apart around a central axis of the optical device.

15. The optical device of claim 14, wherein the respective segment of the second optical element with which each of the plurality of segments of the first optical element forms a Köhler integrator is the segment on the same side of the central axis.

16. The optical device of claim 15, wherein each segment of the secondary optical element is a refractive surface of revolution about a respective diagonal ray from a point on the associated segment of the first optical element to a source point or target point on an opposite side of the central axis.

17. An optical device comprising a plurality of primary optical elements and a plurality of secondary optical elements, wherein each primary optical element is arranged to image one of a common source and a common target onto a respective secondary optical element, and each secondary optical element is arranged to image the other of the common source and the common target onto the respective primary optical element.

18. The optical device of claim 17, wherein the plurality of secondary optical elements are formed by lenticular panels of a secondary lens, and wherein the said other of the common source and the common target comprises a solid state chip on a flat rear face of the secondary lens.

19. The optical device of claim 17, wherein the plurality of primary optical elements are formed by lenticular panels of a Fresnel lens.

* * * * *